(12) United States Patent
Park et al.

(10) Patent No.: US 12,604,753 B2
(45) Date of Patent: Apr. 14, 2026

(54) METAL CLIP APPLIED TO POWER MODULE

(71) Applicant: HYUNDAI MOBIS CO., LTD., Seoul (KR)

(72) Inventors: Se Min Park, Hwaseong-si (KR); Ji Hye Jeong, Seoul (KR)

(73) Assignee: Hyundai Mobis Co., Ltd., Seoul (KR)

( * ) Notice: Subject to any disclaimer, the term of this patent is extended or adjusted under 35 U.S.C. 154(b) by 549 days.

(21) Appl. No.: 18/083,058

(22) Filed: Dec. 16, 2022

(65) Prior Publication Data

US 2023/0395554 A1 Dec. 7, 2023

(30) Foreign Application Priority Data

Jun. 7, 2022 (KR) ........................ 10-2022-0069069

(51) Int. Cl.
| | |
|---|---|
| *H01L 23/00* | (2006.01) |
| *H01L 25/18* | (2023.01) |
| *H10W 72/00* | (2026.01) |
| *H10W 72/30* | (2026.01) |
| *H10W 72/60* | (2026.01) |
| *H10W 90/00* | (2026.01) |

(52) U.S. Cl.
CPC ........... *H10W 72/60* (2026.01); *H10W 72/30* (2026.01); *H10W 72/851* (2026.01); *H10W 72/631* (2026.01); *H10W 72/634* (2026.01); *H10W 72/652* (2026.01); *H10W 72/886* (2026.01); *H10W 90/00* (2026.01); *H10W 90/734* (2026.01); *H10W 90/763* (2026.01); *H10W 90/764* (2026.01)

(58) Field of Classification Search
None
See application file for complete search history.

(56) References Cited

U.S. PATENT DOCUMENTS

| | | | |
|---|---|---|---|
| 6,677,669 B2 * | 1/2004 | Standing ........... | H01L 23/49575 174/541 |
| 8,138,600 B2 * | 3/2012 | Muto ...................... | H01L 24/84 257/E25.012 |
| 8,513,784 B2 * | 8/2013 | Lu ........................... | H01L 24/41 257/723 |
| 9,496,208 B1 * | 11/2016 | Ostrowicki ....... | H01L 23/49551 |

(Continued)

FOREIGN PATENT DOCUMENTS

| | | |
|---|---|---|
| EP | 2 930 747 A1 | 10/2015 |
| KR | 10-2010-0095763 A | 9/2010 |
| KR | 10-2341506 B1 | 12/2021 |

OTHER PUBLICATIONS

Extended European Search Report issued on Nov. 8, 2023 in counterpart European Patent Application No. 22216739.7 (9 pages in English).

(Continued)

*Primary Examiner* — Nishath Yasmeen
(74) *Attorney, Agent, or Firm* — NSIP Law

(57) ABSTRACT

A metal clip disposed on chips to connect the chips to each other, includes a plurality of bonding parts each having a lower surface configured to bond to an upper surface of each of the chips; and an outer side part formed at each of the bonding parts to extend upward from at least a portion of an outer side of respective ones of the bonding parts to form a step therefrom.

13 Claims, 34 Drawing Sheets

1

(56) References Cited

U.S. PATENT DOCUMENTS

| 11,742,318 B2 * | 8/2023 | Milo | H01L 24/38 |
| | | | 438/123 |
| 2005/0112796 A1 * | 5/2005 | Ararao | H01L 23/3672 |
| | | | 438/106 |
| 2007/0040186 A1 * | 2/2007 | Fillion | H01L 24/24 |
| | | | 438/117 |
| 2009/0008775 A1 * | 1/2009 | Tanaka | H01L 24/80 |
| | | | 257/737 |
| 2012/0250253 A1 * | 10/2012 | Chou | H02M 7/003 |
| | | | 361/689 |
| 2016/0064308 A1 * | 3/2016 | Yamada | H01L 23/49811 |
| | | | 257/697 |
| 2016/0322342 A1 * | 11/2016 | Kimura | H01L 23/49524 |
| 2017/0117211 A1 | 4/2017 | Chew et al. | |
| 2017/0317016 A1 | 11/2017 | Heinrich et al. | |
| 2018/0040541 A1 * | 2/2018 | Choi | H01L 23/49568 |
| 2019/0067165 A1 * | 2/2019 | Soda | H01L 23/495 |
| 2020/0350272 A1 | 11/2020 | Hong et al. | |
| 2020/0411421 A1 * | 12/2020 | Teysseyre | H01L 24/37 |

OTHER PUBLICATIONS

Korean Office Action Issued on Oct. 2, 2025, in Counterpart Korean Patent Application No. 10-2022-0069069 (7 Pages in English, 7 Pages in Korean).

* cited by examiner

1

Top view            Bottom view

ENGRAVED PATTERN
IS NOT APPLIED

ENGRAVED PATTERN
IS APPLIED

121

121-B

Heatsink

TIM

DBC
(Upper)

Solder

Spacer

DBC
(Lower)

DIODE

IGBT

Signal pin

Lead-frame

EMC

Heatsink

TIM

331

UPPER MOLD

MOLDING MATERIA
INJECTION PORT

MOLDING MATERIAL
DISCHARGE PORT

POWER MODULE
IS PUT

LOWER MOLD

640S

630S

A-A

B-B

METAL CLIP APPLIED TO POWER MODULE

CROSS-REFERENCE TO RELATED APPLICATIONS

This application claims the benefit under 35 U.S.C. § 119 of Korean Patent Application No. 10-2022-0069069, filed on Jun. 7, 2022, in the Korean Intellectual Property Office, the entire disclosure of which is incorporated herein by reference for all purposes.

TECHNICAL FIELD

The following disclosure relates to a metal clip applied to a power module of an inverter.

BACKGROUND

Recently, in a vehicle field, research into and development of another type of vehicle that is environmentally friendly and considers fuel efficiency, that is, a hybrid vehicle or an electric vehicle, from a vehicle using a combustion engine have been actively conducted.

The hybrid vehicle is driven with two power sources by linking an existing engine and a motor driven by electric energy to each other, and the electric vehicle is driven only with a motor driven by electric energy. Therefore, the hybrid vehicle and the electric vehicle have been regarded as realistic alternative next-generation vehicles that have recently attracted attention mainly in the United States and Japan due to effects such as a decrease of environmental pollution due to exhaust gases and improvement of fuel efficiency.

Such a hybrid vehicle or electric vehicle is mounted with a high-capacity battery as a driving source for driving an electric motor to supply power to the electric motor when necessary and charge the battery with electric energy generated from a regenerative power source when the hybrid vehicle or the electric vehicle is decelerated or stopped.

Such an electric motor for a vehicle may mainly include a rotor having a plurality of magnetic materials such as permanent magnets and a stator generating an electromagnetic force in order to rotate the rotor.

In addition, the hybrid vehicle and electric/fuel cell vehicles have used an inverter converting high-voltage direct current (DC) power generated from batteries or fuel cells into three-phase (U, V, and W phases) alternating current (AC) power in the electric motor for a vehicle in order to charge/discharge internally produced electrical energy.

In addition, the inverter includes a power module in which power semiconductors are integrated.

Since an amount of heat generated by the power module is large due to torque transfer for quick starting of the inverter, an engine room of a high temperature, and the like, at the time of starting of the inverter, the power module is disposed on an inverter heat sink provided in an inverter housing for heat dissipation, such that the heat generated by the power module is cooled.

Meanwhile, in the related art, the power module has been mounted on a flat surface of an upper portion of the inverter heat sink.

In this case, a soldering method is mainly used as an adhesion method between the power module and the inverter heat sink, but a phenomenon in which the power module is misaligned from a design position at the time of melting a solder occurs. For this reason, when the power module is mounted on the inverter heat sink, the power module is deviated from the design position, such that manufacturing defects of products are increased.

In addition, in the related art, when the power module is manufactured, a soldering process is divided into a primary process and a secondary process, such that a defective rate according to each soldering process increases, and types of mounted components of the power module are many, such that there is a difficulty in manufacturing the power module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a metal clip disposed on chips to connect the chips to each other, includes a plurality of bonding parts each having a lower surface configured to bond to an upper surface of each of the chips; and an outer side part formed at each of the bonding parts to extend upward from at least a portion of an outer side of respective ones of the bonding parts to form a step therefrom.

The metal clip may further include a pressing groove recessed inward along a boundary between an upper surface of each of the bonding parts and the outer side part, on the upper surface of each of the bonding parts.

The pressing groove of each of the bonding parts may be formed by pressing an upper surface of a region in which the pressing groove of each of the bonding parts is formed.

The lower surface of each of the bonding parts may be flat.

A thickness of the bonding part and a thickness of the outer side part may be the same.

A lower portion of the outer side part may be formed to have an empty space.

The outer side part may be bent at a predetermined angle from the bonding part to extend upward.

An angle between a lower surface of the outer side part and the lower surface of the bonding part may be less than a right angle.

The outer side part at each of the bonding parts may be symmetrical to another outer side part respective to a center of a corresponding one of the bonding parts.

Each of the bonding parts may have a rectangular shape when viewed from above, and the outer side part at each of the bonding parts may be formed at edges of respective ones of the bonding parts in three of four directions or in all the four directions.

One or more through holes penetrating through a connection part connecting two adjacent bonding parts of the plurality of bonding parts are formed in the connection part.

At least one of the one or more through holes may be formed in an elliptical shape.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
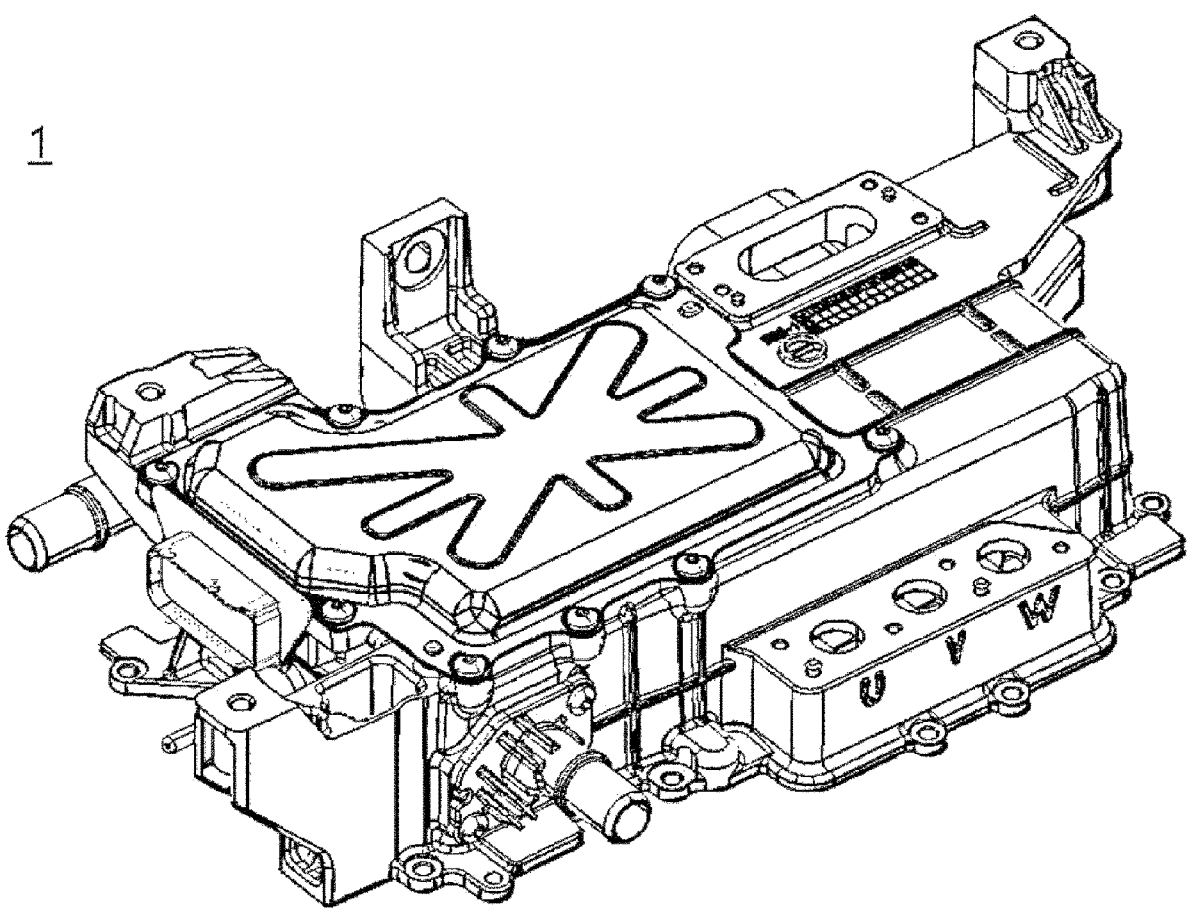
FIG. 1 is a perspective view of an inverter according to an embodiment of the present invention.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

An embodiment of the present invention is directed to providing a metal clip of a power module capable of improving thermal performance of the power module, securing structural stability of the power module, and simplifying an assembly process of the power module by replacing a wire according to the related art connecting a chip and a substrate to each other with the metal clip.

Figure 2:
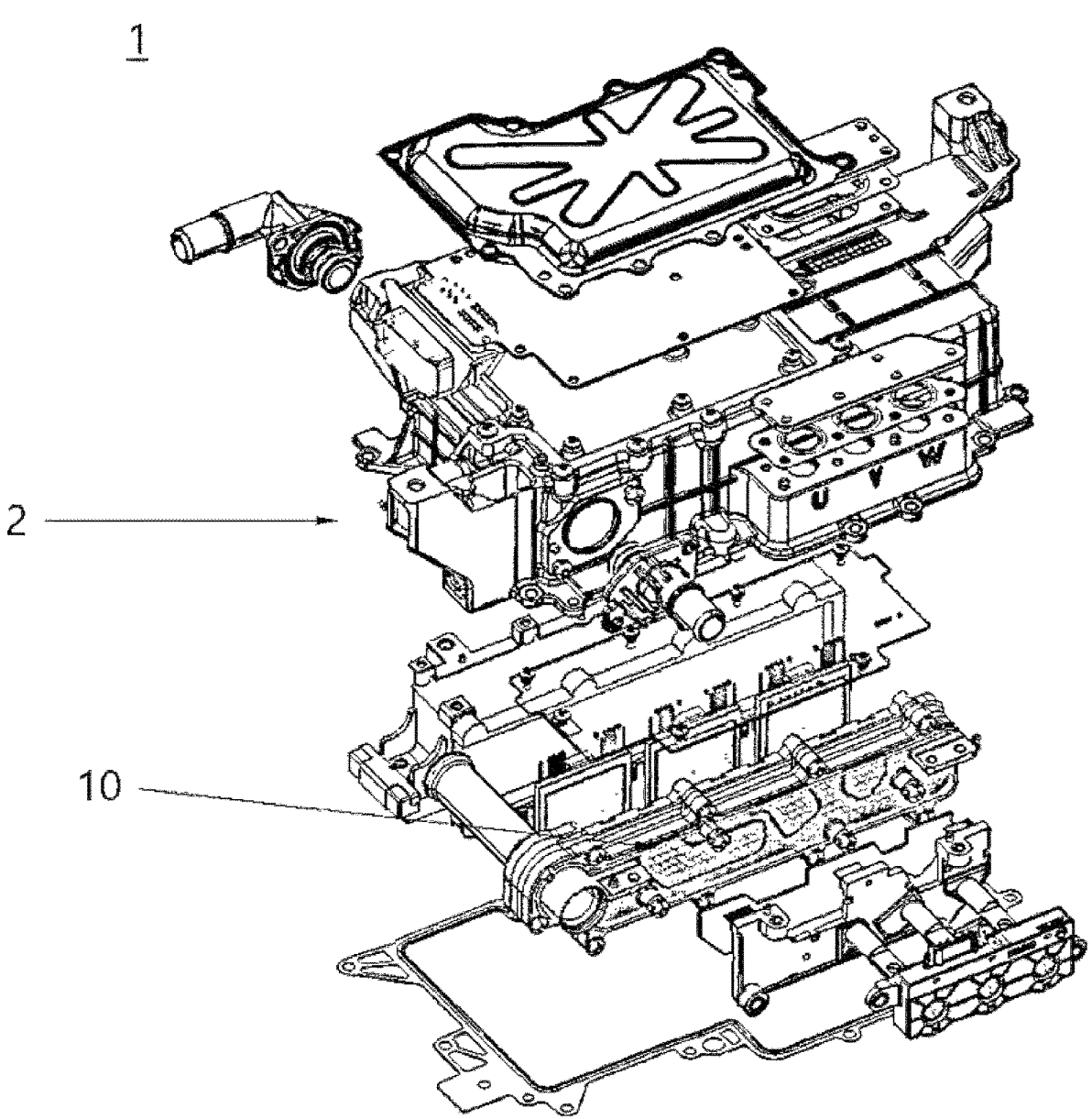
FIG. 2 is an exploded perspective view of FIG. 1.

FIG. 1 is a perspective view of an inverter according to an embodiment of the present invention, and FIG. 2 is an exploded perspective view of FIG. 1. An inverter 1 has a structure in which various components including a power module pack 10 are accommodated in a housing 2.

The present invention relates to a structure and a manufacturing method of the power module pack 10 capable of improving performance of the inverter, a power module 20 accommodated in the power module pack, and a metal clip 30 applied to the power module.

Figure 3:
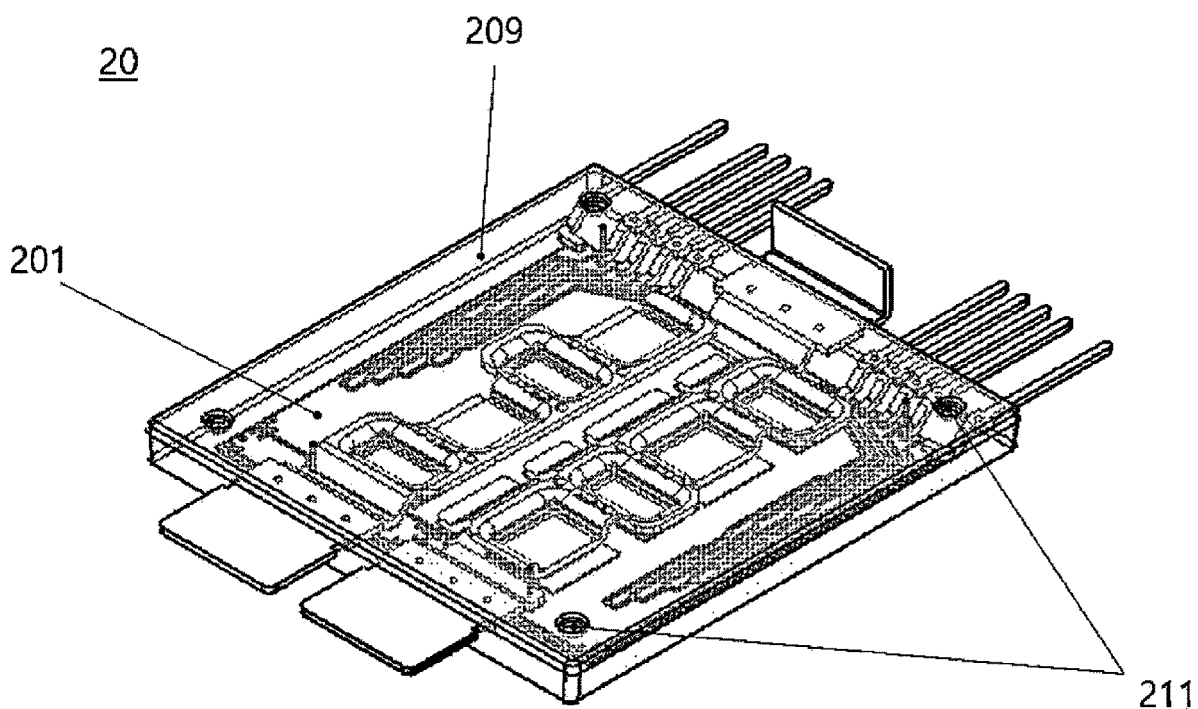
FIG. 3 is a perspective view of a power module according to an embodiment of the present invention.
Figure 4:
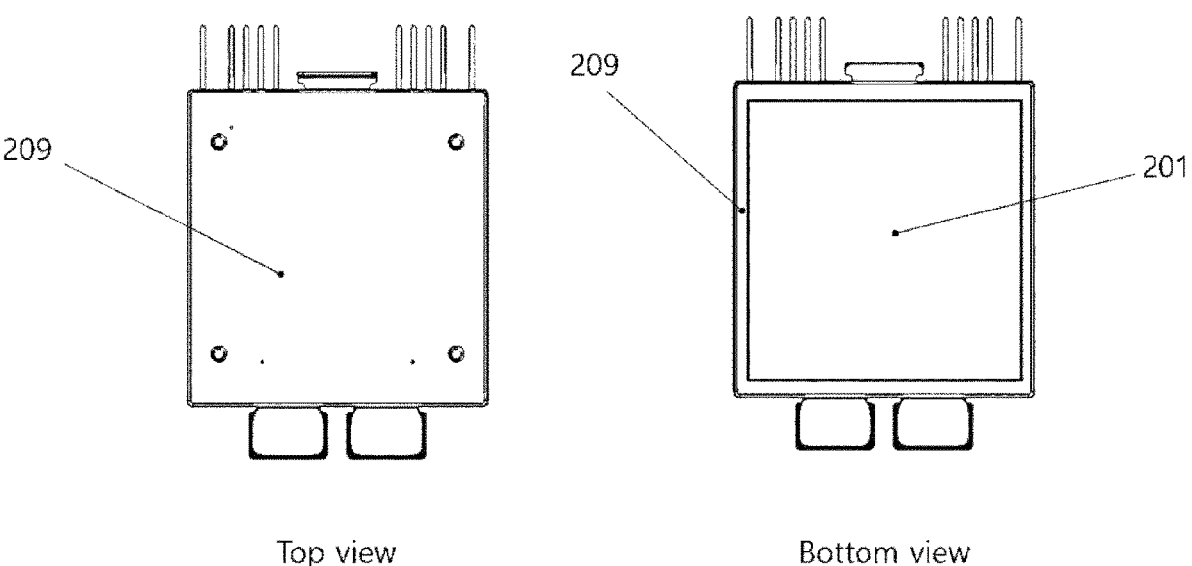
FIG. 4 is a top view and a bottom view of the power module.

First, the power module 20 according to the present invention will be briefly described below. FIG. 3 is a perspective view of a power module according to an embodiment of the present invention, and FIG. 4 is a top view and a bottom view of the power module. The power module 20 has a structure in which components including the circuit board 201 are molded by a molding part 209. In this case, as illustrated in FIGS. 3 and 4, a lower portion of the circuit board 201 is exposed to the outside of the molding part 209, and an upper portion of the circuit board 201 is occluded by the molding part 209. In the power module according to the present invention, most of the heat generated by the power module is transferred to the circuit board disposed at a lower portion of the power module, and accordingly, heat of the lower portion of the power module needs to be intensively dissipated. Forming a heat dissipation path of the power module downward is to improve a manufacturing property, performance, and the like, of the power module itself, and more detailed contents will be described later.

Hereinafter, respective components according to the present invention will be described with reference to such characteristics of the power module.
<Power Module Pack>

Figure 5:
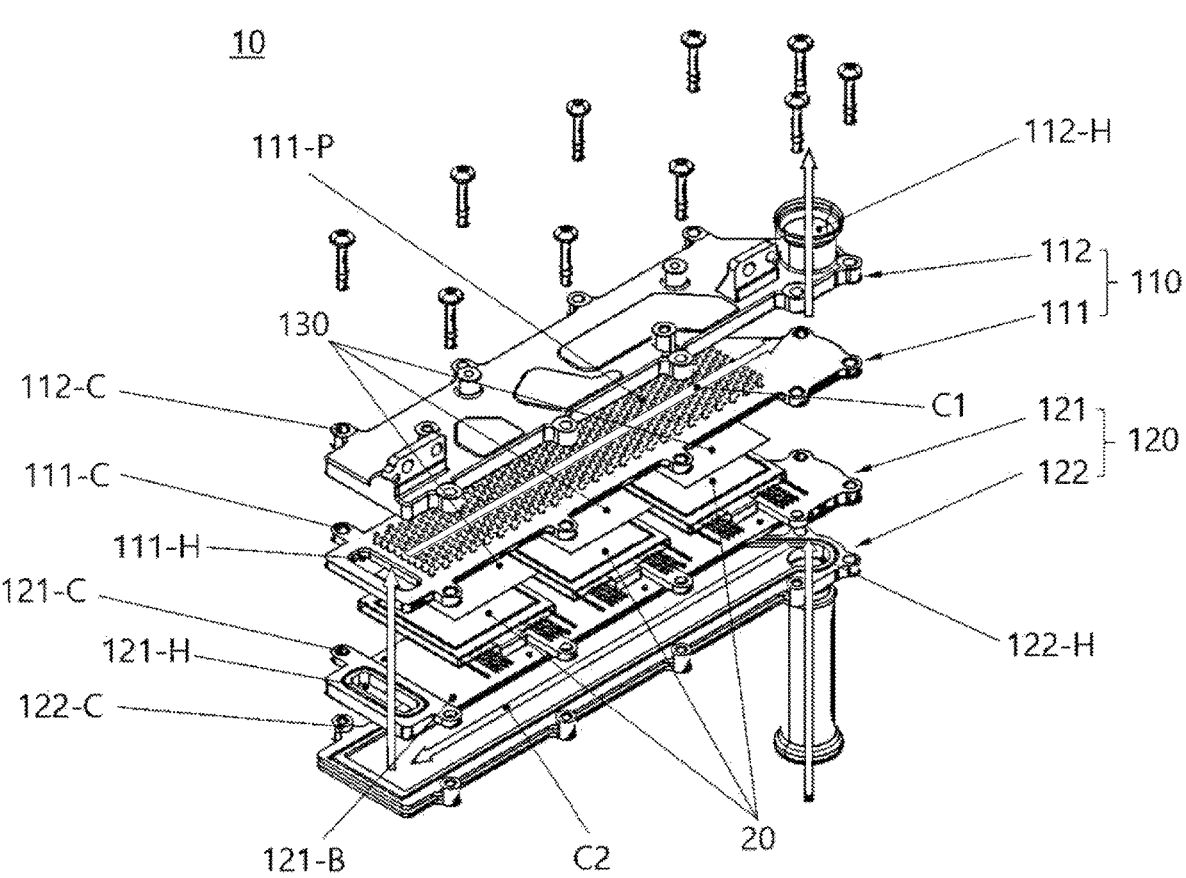
FIG. 5 is an exploded perspective view of a power module pack according to an embodiment of the present invention.

FIG. 5 is an exploded perspective view of a power module pack according to an embodiment of the present invention, and is an exploded view of the power module pack of FIG. 2. The power module pack 10 mainly includes a heat sink 110 and a heat sink cover 120, and has a structure in which the power modules 20 are interposed between the heat sink 110 and the heat sink cover 120.

The heat sink 110 includes a first cooling plate 111 and a first cover 112, and the first cover 112 is stacked on and coupled to one surface of the first cooling plate 111 to form a first coolant flow channel C1 through which a coolant flows between the first cooling plate 111 and the first cover 112.

The heat sink cover 120 includes a second cooling plate 121 and a second cover 122, and the second cover 122 is stacked on and coupled to one surface of the second cooling plate 121 to form a second coolant flow channel C2 through which a coolant flows between the second cooling plate 121 and the second cover 122.

That is, the heat sink 110 and the heat sink cover 120 correspond to structures in which coolants flow to cool the power modules 20 interposed therebetween. A flow path of the coolant is as follows. A first through hole 111-H penetrating through the first cooling plate 111 is formed at one end portion of the first cooling plate 111, a second through hole 121-H penetrating the second cooling plate 121 is formed at one end portion of the second cooling plate 121, and the first coolant flow channel C1 and the second coolant flow channel C2 communicate with each other through the first through hole 111-H and the second through hole 121-H. In addition, a first cover through hole 112-H penetrating through the first cover 112 is formed at the other end portion of the first cover 112, and an inlet is provided in the first cover through hole 112-H, such that the coolant is introduced from the outside through the inlet and the first cover through hole 112-H, and a second cover through hole 122-H penetrating through the second cover 122 is formed at the other end portion of the second cover 122, and an outlet is provided in the second cover through hole 122-H, such that the coolant is discharged to the outside through the outlet and the second cover through hole 122-H.

Here, as illustrated in FIG. 5, a plurality of heat dissipation fins 111-P protruding outward are provided on one surface of the first cooling plate 111 (upper surface of the first cooling plate in FIG. 5). A heat sink structure including the plurality of heat dissipation fins is provided, such that heat dissipation performance of heat transferred from the power module may be improved. Meanwhile, as described above, in the power module according to the present invention, the heat dissipation path is formed downward, and accordingly, a heat dissipation fin structure may not be provided on one surface of the second cooling plate 121 (lower surface of the second cooling plate in FIG. 5) unlike the first cooling plate 111. By forming the heat dissipation path of the power module in one direction and installing the heat dissipation fin structure in only one direction as described above, a manufacturing cost may be reduced.

In addition, as illustrated in FIG. 5, the first cover 112, the first cooling plate 111, the second cooling plate 121, and the second cover 122 are provided with bolt coupling parts 112-C, 111-C, 121-C, and 122-C protruding laterally, respectively, and the bolt coupling parts 112-C, 111-C, 121-C, and 122-C of the first cover, the first cooling plate, the second cooling plate, and the second cover are stacked and arranged in a line and are coupled to each other at a time through one bolt. The numbers of each of bolt coupling parts may be plural, and the first cover, the first cooling plate, the second cooling plate, and the second cover are configured to be fastened to each other at a time through one bolt as described above, such that manufacturing convenience of the power module pack may be improved.

Figure 6:
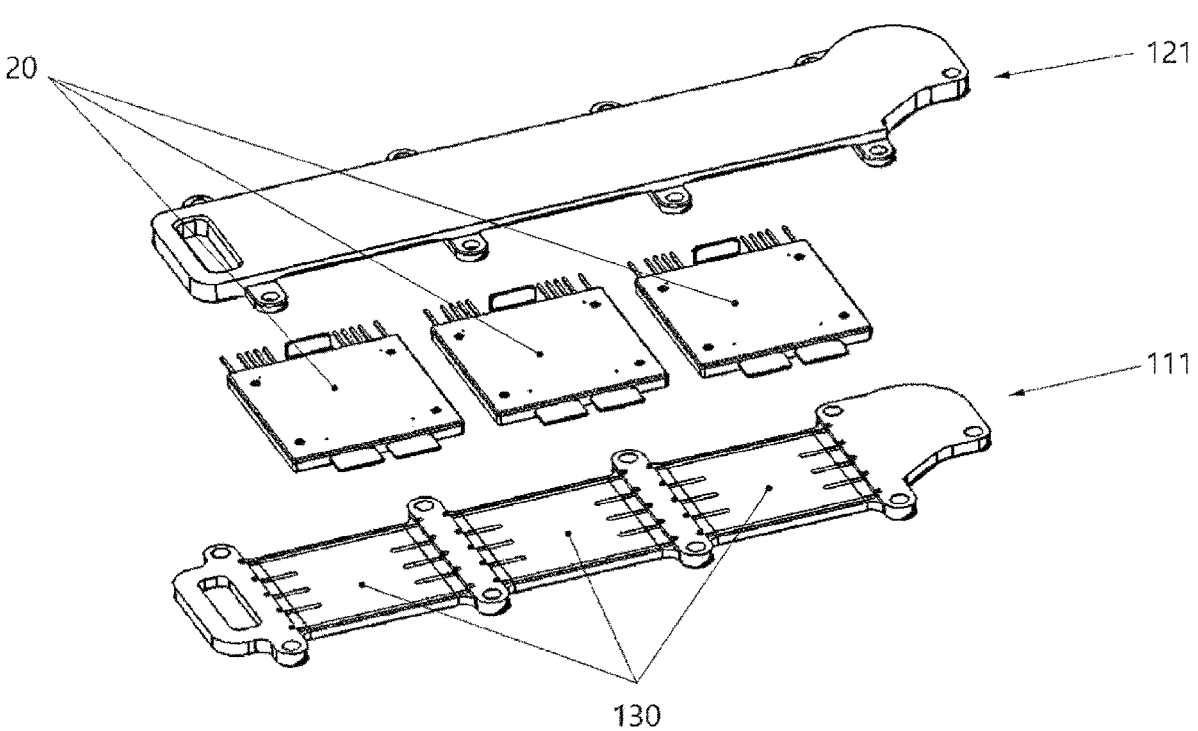
FIG. 6 is a perspective view illustrating a first cooling plate, a second cooling plate, and power modules separated from each other.

FIG. 6 is a perspective view illustrating a first cooling plate, a second cooling plate, and power modules separated from each other. As illustrated in FIG. 6, one or more power modules 20 are provided in the power module pack, and each of the power modules 20 is interposed between the first cooling plate 111 and the second cooling plate 121. A plurality of power modules 20 may be provided and disposed side by side in a line. That is, the plurality of power modules may be disposed in a single-layer parallel structure.

A lower surface of the power module 20 is soldered to the other surface of the first cooling plate 111 (upper surface of the first cooling plate in FIG. 6). Here, since the heat dissipation path of the power module 20 is formed downward, an upper surface of the power module 20 may not be bonded to the other surface of the second cooling plate (lower surface of the second cooling plate in FIG. 6).

In this case, in the present invention, the power module 20 and the first cooling plate 111 may be soldered to each other using a preform solder. More specifically, the preform solders 130 are disposed between lower surfaces of the power modules 20 and the other surface of the first cooling plate 111, respectively, and the power modules 20 are soldered to the first cooling plate 111 by the preform solders 130.

The preform solder is a metal alloy bonding material, and is a sheet-type solder having a predetermined size and shape, unlike a polymer-based adhesive according to the related art. The polymer-based adhesive according to the related art has a thermal conductivity of 3 to 5 W, and thus, has a difficulty in securing sufficient thermal performance in an inverter system that requires a high power density and heat dissipation performance, but the preform solder has a thermal conductivity of 40 to 50 W higher than the thermal conductivity of the polymer-based adhesive according to the related art, and thus, excellent thermal performance may be secured by applying the preform solder.

Figure 7:
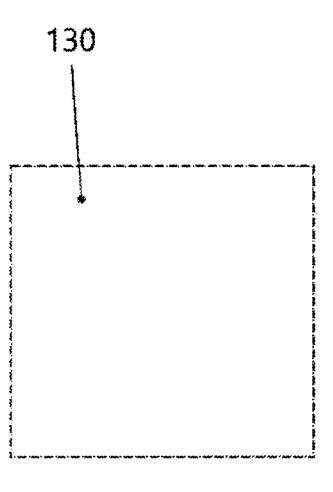
FIG. 7 is a view for describing a preform solder according to an embodiment of the present invention.
Figure 7:
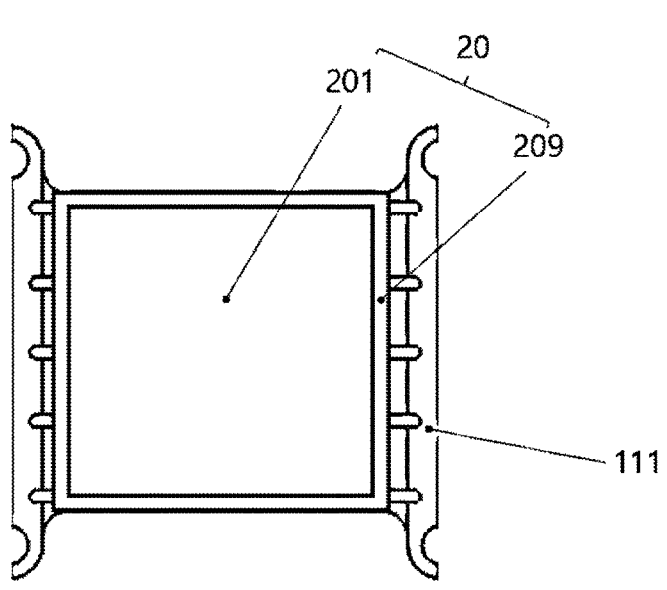

FIG. 7 is a view for describing a preform solder according to an embodiment of the present invention. The preform solder 130 has a shape corresponding to the power module Specifically, an upper surface of the preform solder 130 has the same shape and width as a lower surface of the circuit board 201 of the power module 20. That is, the preform solder is in direct surface-contact with the lower surface of the circuit board of the power module, and since the preform solder is formed in the same size and shape as the circuit board of the power module, solder overflow at the time of soldering may be prevented, and the use of an unnecessary solder may be decreased.

Meanwhile, as the preform solder melts and flows at the time of soldering, the power module put on the preform solder moves along the flow of the preform solder, such that a position or a posture of the power module may be misaligned, and a problem that voids are generated inside the preform solder at the time of soldering may occur. In order to solve such a problem, the present invention adopts the following configuration.

Figure 8:
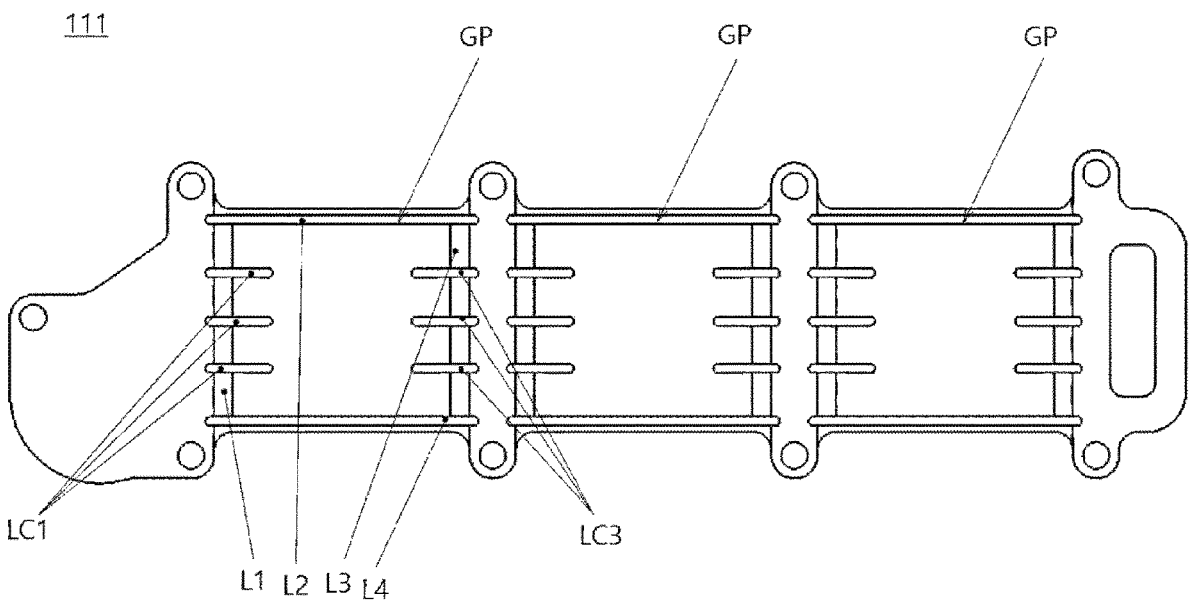
FIG. 8 is a view illustrating the other surface of the first cooling plate.

FIG. 8 is a view illustrating the other surface of the first cooling plate. As illustrated in FIG. 8, engraved patterns GP recessed inward are formed at positions corresponding to positions where the respective power modules 20 are seated, on the other surface of the first cooling plate 111, that is, the upper surface of the first cooling plate 111 facing the lower surfaces of the power modules 20. Since the engraved pattern is formed as described above, voids generated inside the solder at the time of soldering are discharged to the outside along the engraved pattern, such that it is possible to prevent generation of a gap in a soldering part due to the voids, and accordingly, a defect in heat dissipation performance may be decreased.

Figure 9:
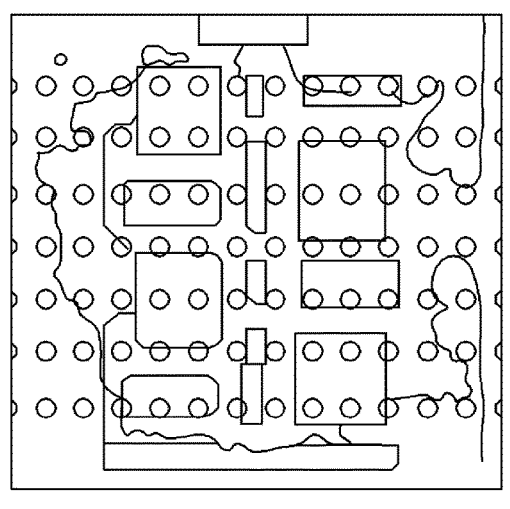
FIG. 9 is views illustrating photographs of a soldering part.
Figure 9:
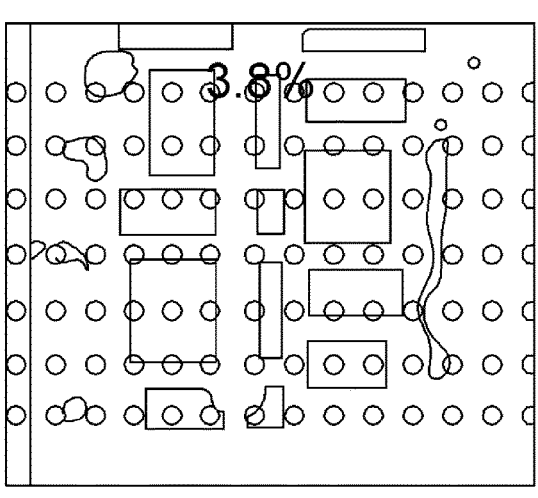

FIG. 9 is views illustrating photographs of a soldering part. A left photograph of FIG. 9 is a photograph when an engraved pattern is not applied, and a right photograph of FIG. 9 is a photograph when the engraved pattern is applied. As illustrated in FIG. 9, it may be confirmed that when the engraved pattern is not applied, a great gap is generated in the soldering part, whereas when the engraved pattern is applied, a gap is significantly decreased in the soldering part.

Figure 10:
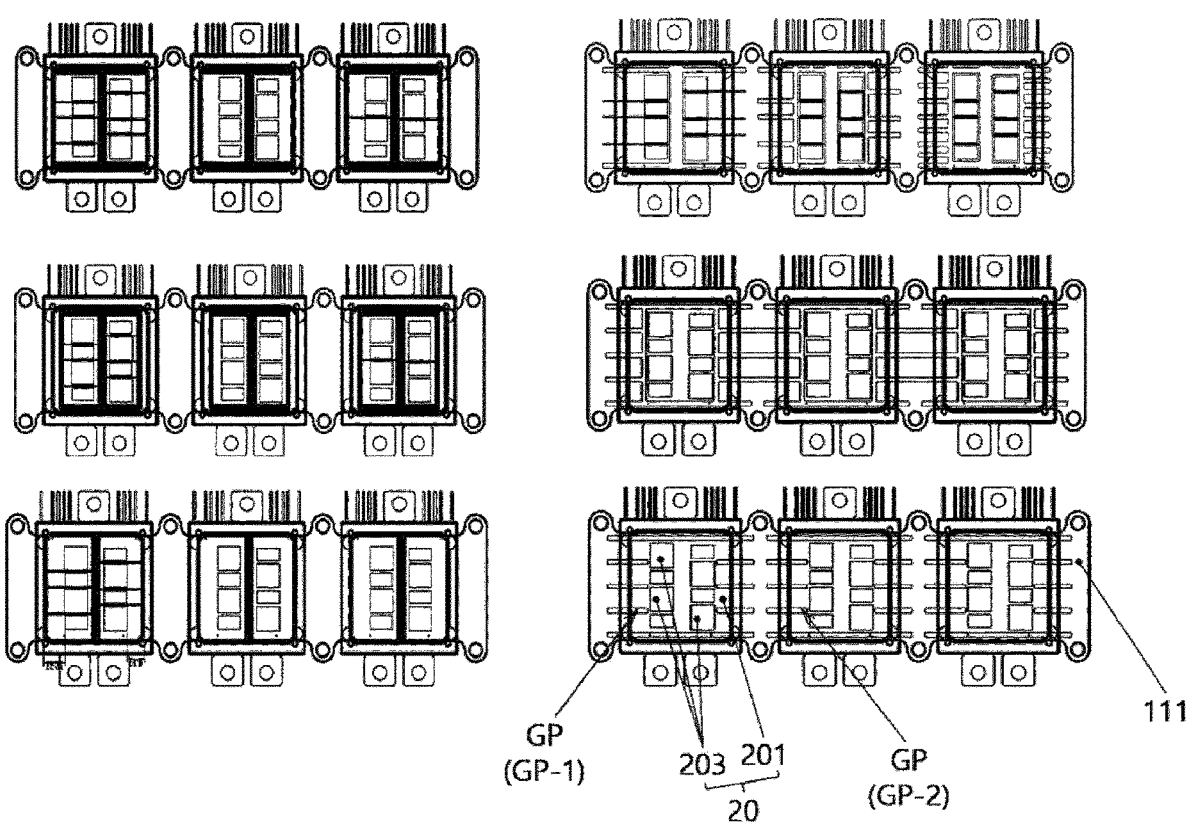
FIG. 10 is views illustrating various embodiments of an engraved pattern.

FIG. 10 is views illustrating various embodiments of an engraved pattern. As illustrated in FIG. 10, the engraved pattern may be configured in various shapes. In this case, the engraved pattern of FIG. 8 is an engraved pattern illustrated on the lower right of FIG. 10, and corresponds to a preferable example among various engraved patterns. The engraved pattern will be described below with reference to FIGS. 8 and 10.

The engraved pattern GP includes a first line L1, a second line L2, a third line L3, and a fourth line L4 sequentially connected to each other to form a frame having a rectangular shape, first cross lines LC1 formed perpendicular to the line L1 and crossing the first line L1, and third cross lines LC3 formed perpendicular to the third line L3 and crossing the third line L3.

In this case, the first line L1, the second line L2, the third line L3, and the fourth line L4 are formed along edges of the circuit board 201 of each power module 20, the first cross lines LC1 are formed to extend in one side direction from the outermost one side (left side in FIG. 8) of chips 203 mounted in each power module 20, and the third cross lines LC3 are formed to extend in the other side direction from the outermost other side (right side in FIG. 8) of the chips 203 mounted in each power module 20.

In addition, the second line L2 is formed to extend in one side direction so that one end thereof exceeds the first line L1 and is formed to extend in the other side direction so that the other end thereof exceeds the third line L3, and the fourth line L4 is formed to extend in one side direction so that one end thereof exceeds the first line L1 and is formed to extend in the other side direction so that the other end thereof exceeds the third line L3.

In addition, a plurality of first cross lines LC1 are formed and disposed at equal intervals, a plurality of third cross lines LC3 are formed and disposed at equal intervals, and the respective lines (i.e., the first to the fourth line, the first cross lines, and the third cross lines) are mirror-symmetrical to each other with respect to the center between the first line L1 and the third line L3.

In addition, widths of the first line L1 and the third line L3 are greater than widths of the second line L2, the fourth line L4, the first cross lines LC1, and the third cross lines LC3. In addition, the widths of the first line L1 and the third line L3 may be the same as each other, and the widths of the second line L2, the fourth line L4, the first cross lines LC1, and the third cross lines LC3 may be the same as each other.

Since the engraved pattern corresponding to each power module has the shape as described above, it is possible to prevent the generation of the gap due to the voids in the soldering part.

Furthermore, as illustrated in FIG. 10, it is preferable that the engraved patterns GP each corresponding to two adjacent power modules are separated from each other. More specifically, when any two adjacent power modules of one or more power modules are referred to as a first power module and a second power module, respectively, an engraved pattern GP-1 corresponding to a position where the first power module is seated and an engraved pattern GP-2 corresponding to a position where the second power module is seated are separated from each other. Accordingly, an adverse effect between the two adjacent power modules may be prevented.

Figure 11:
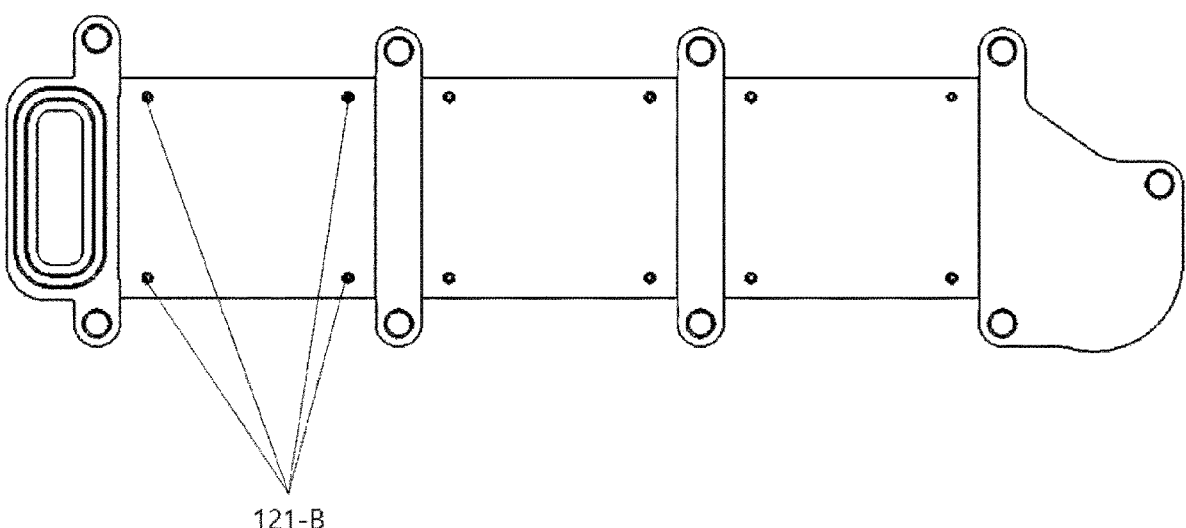
FIG. 11 is a view illustrating the other surface of the second cooling plate.

Referring to FIGS. 3 to 6 again, one or more engraved grooves 211 recessed inward are formed in the upper surface of each power module 20, and embossed projections 121-B protruding outward are formed, respectively, at positions each corresponding to one or more engraved grooves 211 of each power module 20 on the other surface of the second cooling plate 121. FIG. 11 is a view illustrating the other surface of the second cooling plate. As illustrated in FIG. 11, the embossed projections 121-B protruding downward are formed on the other surface of the second cooling plate 121, that is, the lower surface of the second cooling plate 121 facing the upper surface of the power module 20.

In addition, each embossed projection 121-B of the second cooling plate is inserted into each engraved groove 211 of each power module, such that a position of the power module 20 is fixed. This may allow the power module to be maintained at its original position by preventing a phenomenon in which the power module seated on the solder is misaligned because the solder melts at the time of soldering.

Hereinafter, a soldering pressure jig for manufacturing a power module pack will be described.

Figure 12:
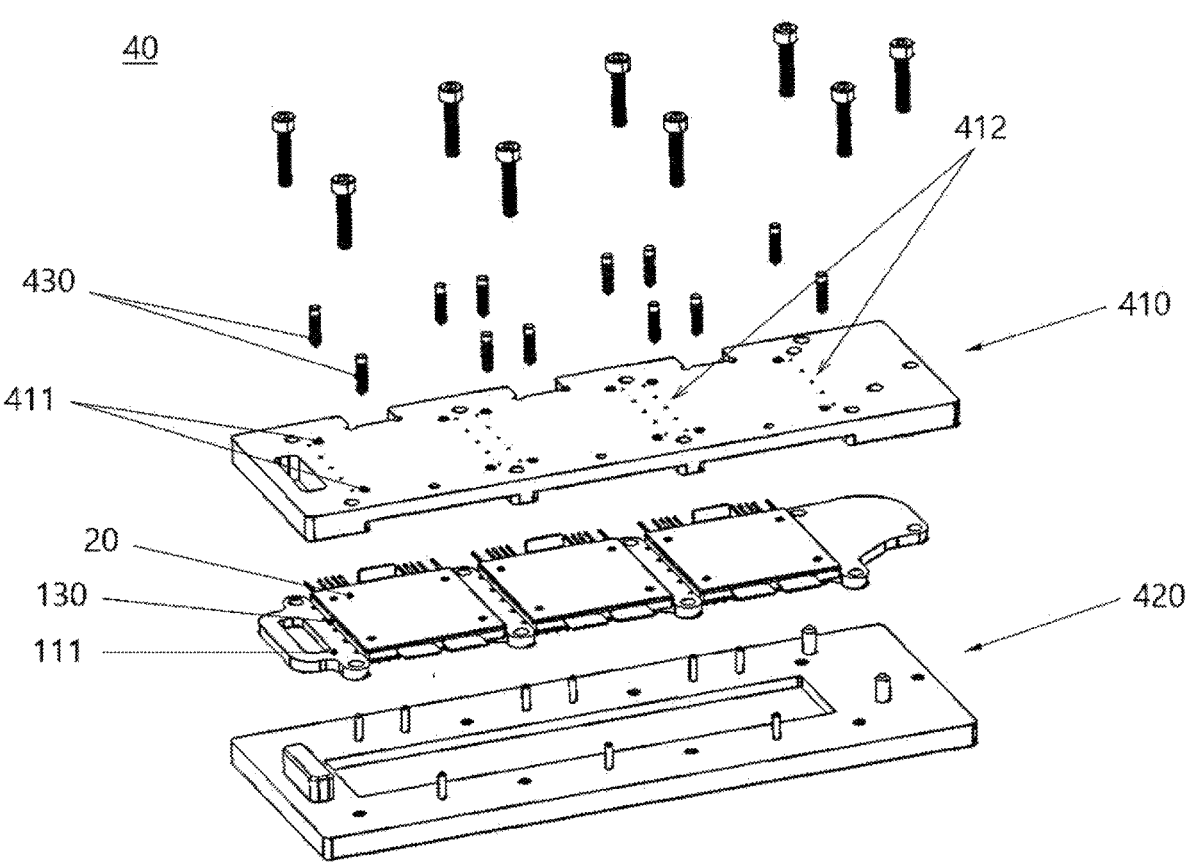
FIG. 12 is a view illustrating a soldering pressure jig according to an embodiment of the present invention.
Figure 13:
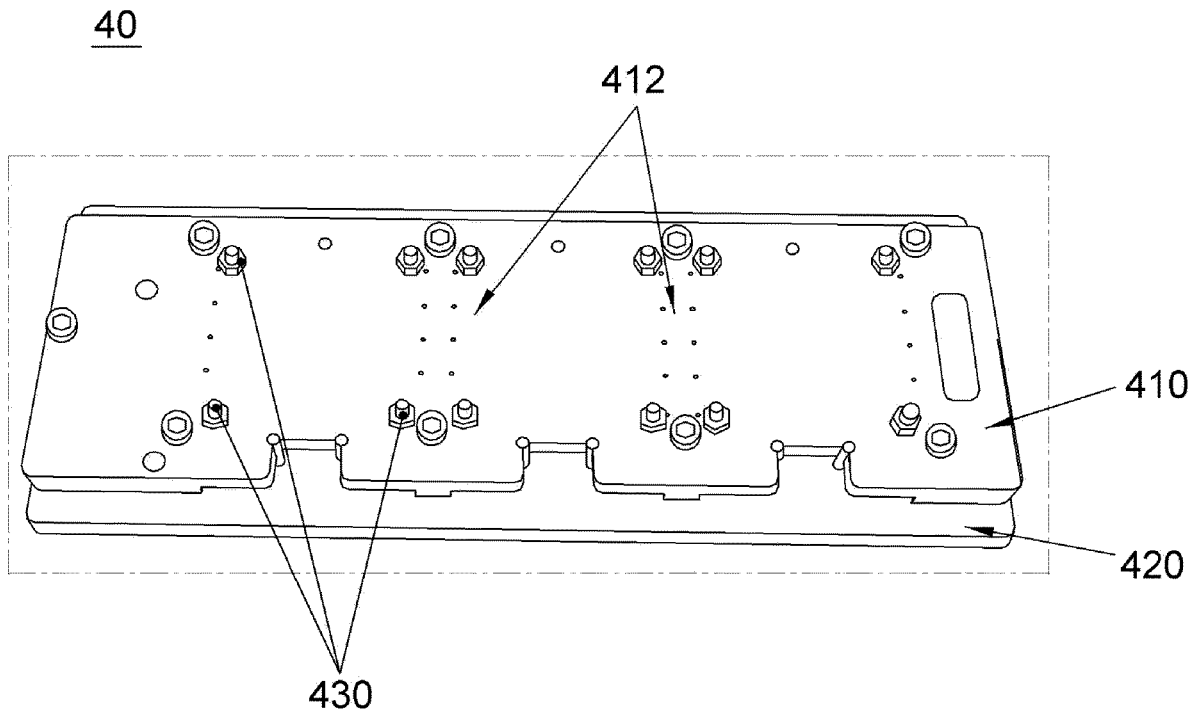
FIG. 13 is a view illustrating a photograph of the pressure jig of FIG. 12.

FIG. 12 is a view illustrating a soldering pressure jig according to an embodiment of the present invention, and FIG. 13 is a view illustrating a photograph of the pressure jig of FIG. 12. The soldering pressure jig 40 according to the present invention includes an upper jig 410 and a lower jig 420.

The first cooling plate 111, the preform solders 130, and the power modules may be sequentially stacked on the lower jig 420, the upper jig 410 may be bolted to the lower jig 420 using bolts, and soldering may be then performed. In this case, a plurality of through holes 411 penetrating through the upper jig may be formed at positions of the upper jig 410 corresponding to each power module 20, and ball plungers 430 may penetrate through the corresponding through holes 411 to pressurize an upper portion of each power module 20. In this case, the ball plungers 430 penetrate through the upper jig 410, such that end portions of the ball plungers 430 may be inserted into the engraved grooves 211 formed in the upper surface of the power module described above to pressurize the power module 20.

When a pressure applied to the solder at the time of soldering is excessively weak, many voids are generated inside the solder, and thus, it is preferable to perform the soldering while applying a predetermined level of pressure to the solder. By appropriately pressurizing and balancing the power module at multiple points at the same time, it is possible to prevent the power module from being inclined to one side at the time of soldering, and accordingly, soldering characteristics may be improved and a thickness of the soldering may be evenly maintained.

That is, the present invention may provide the above-described advantages by forming the through holes 411 in the upper jig 410 and adjusting a pressure applied to the solder through the ball plungers 430. Here, screw threads may be formed in each of the ball plunger 430 and the through hole 411 of the upper jig to appropriately adjust a desired pressure using a wrench or the like.

Furthermore, referring to FIGS. 12 and 13 again, a plurality of vent holes 412 penetrating through the upper jig 410 are formed in the upper jig 410. The vent holes 412 function as passages through which the voids generated inside the solder at the time of soldering may be discharged to the outside to assist in improving soldering characteristics. In this case, the plurality of vent holes 412 may be formed outside each power module 20, that is, may be formed to be misaligned with each power module.

Power Module>

Figure 14:
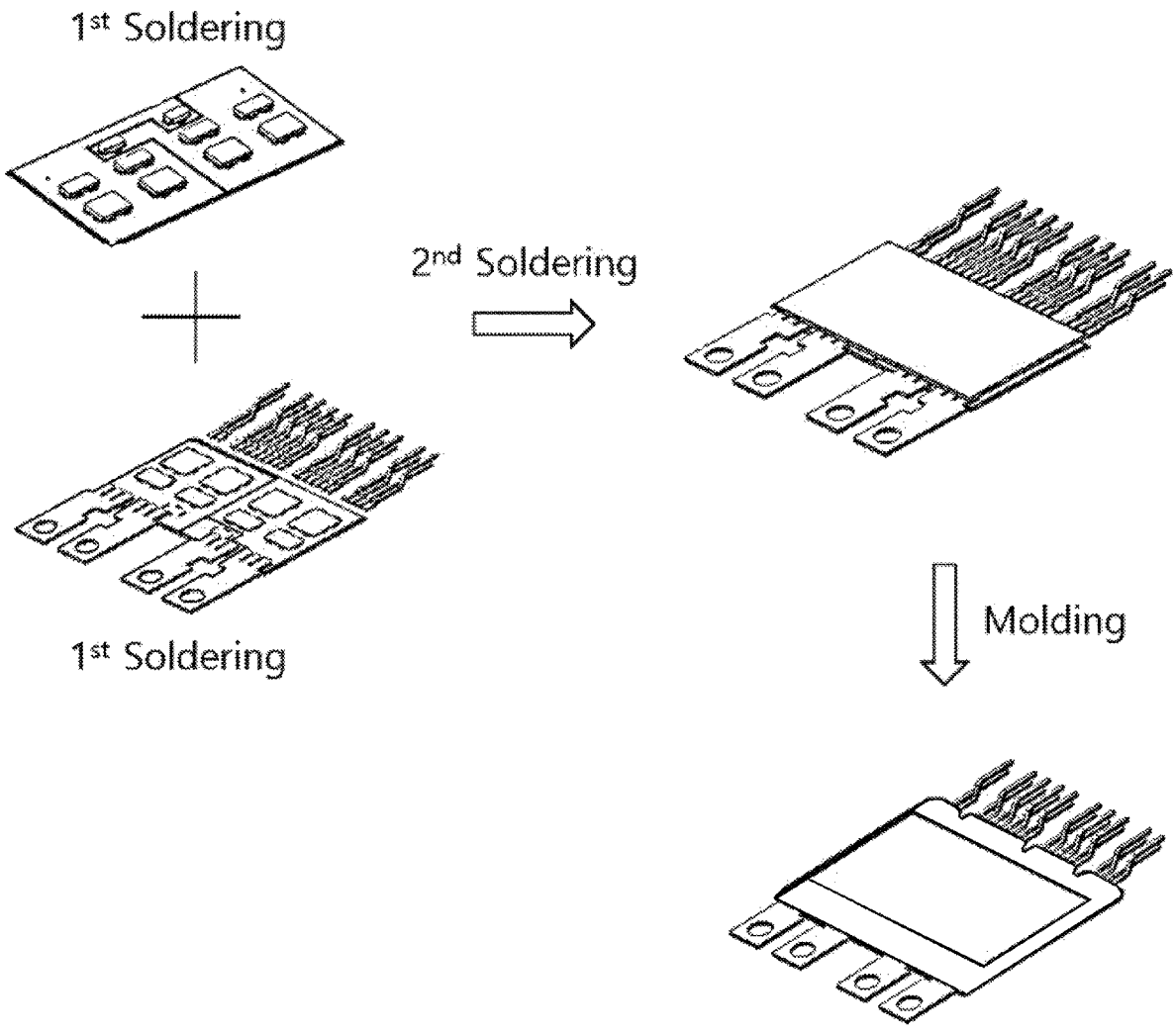
FIG. 14 is a view illustrating a power module according to the related art.
Figure 15:
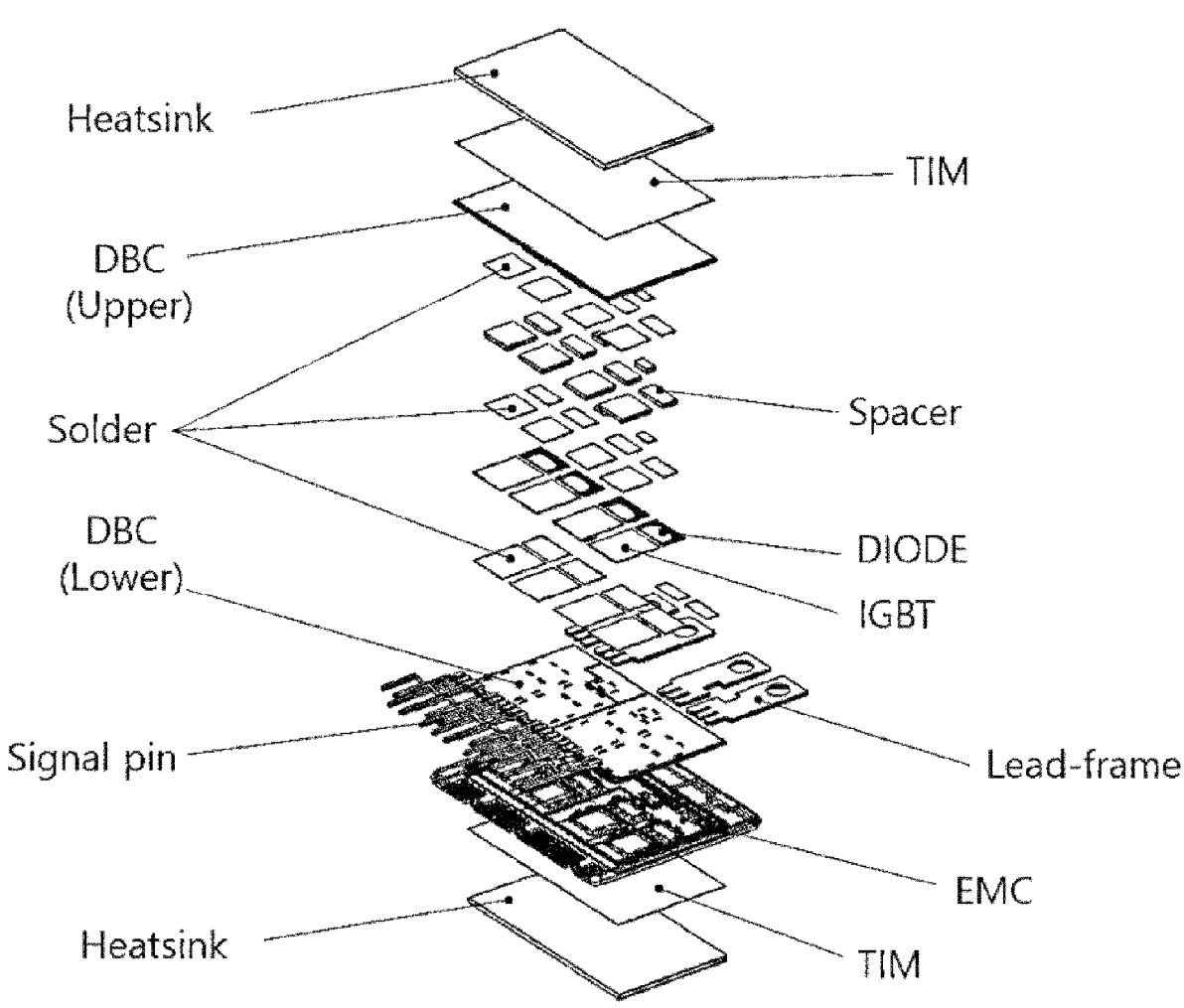
FIG. 15 is an exploded perspective view of the power module according to the related art.

FIG. 14 is a view illustrating a power module according to the related art, and FIG. 15 is an exploded perspective view of the power module according to the related art. The power module according to the related art has a structure in which a lower substrate and mounted components and an upper substrate and mounted components are primarily soldered to each other, and the primarily soldered lower substrate and upper substrate are secondarily soldered to each other, which has a problem that a manufacturing cost and a manufacturing cycle time increase. In addition, since defects of products occur in each soldering process, there is a problem that a defective rate is increased at the time of the secondary soldering process as described above.

The power module according to the present invention has been made in an effort to solve such a problem, and provides an integrated soldering process capable of integrating primary and secondary soldering processes according to the related art and a power module structure based on the integrated soldering process.

Figure 16:
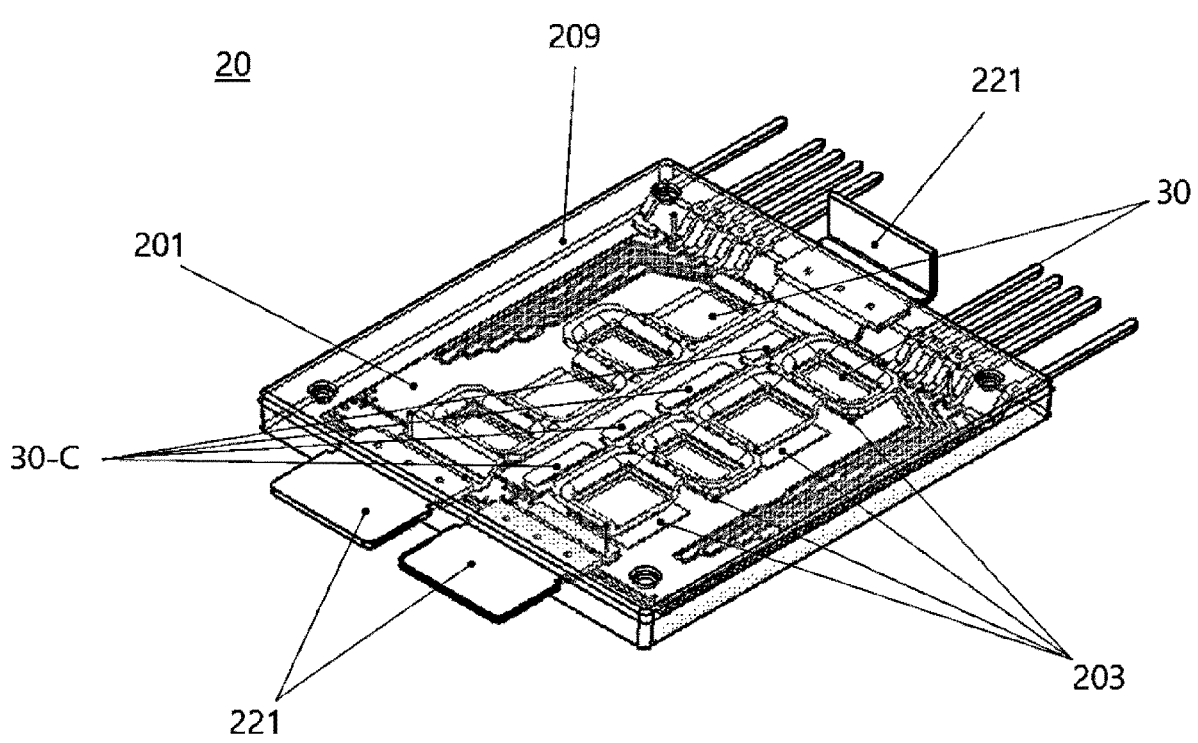
FIG. 16 is a perspective view of a power module according to an embodiment of the present invention.
Figure 17:
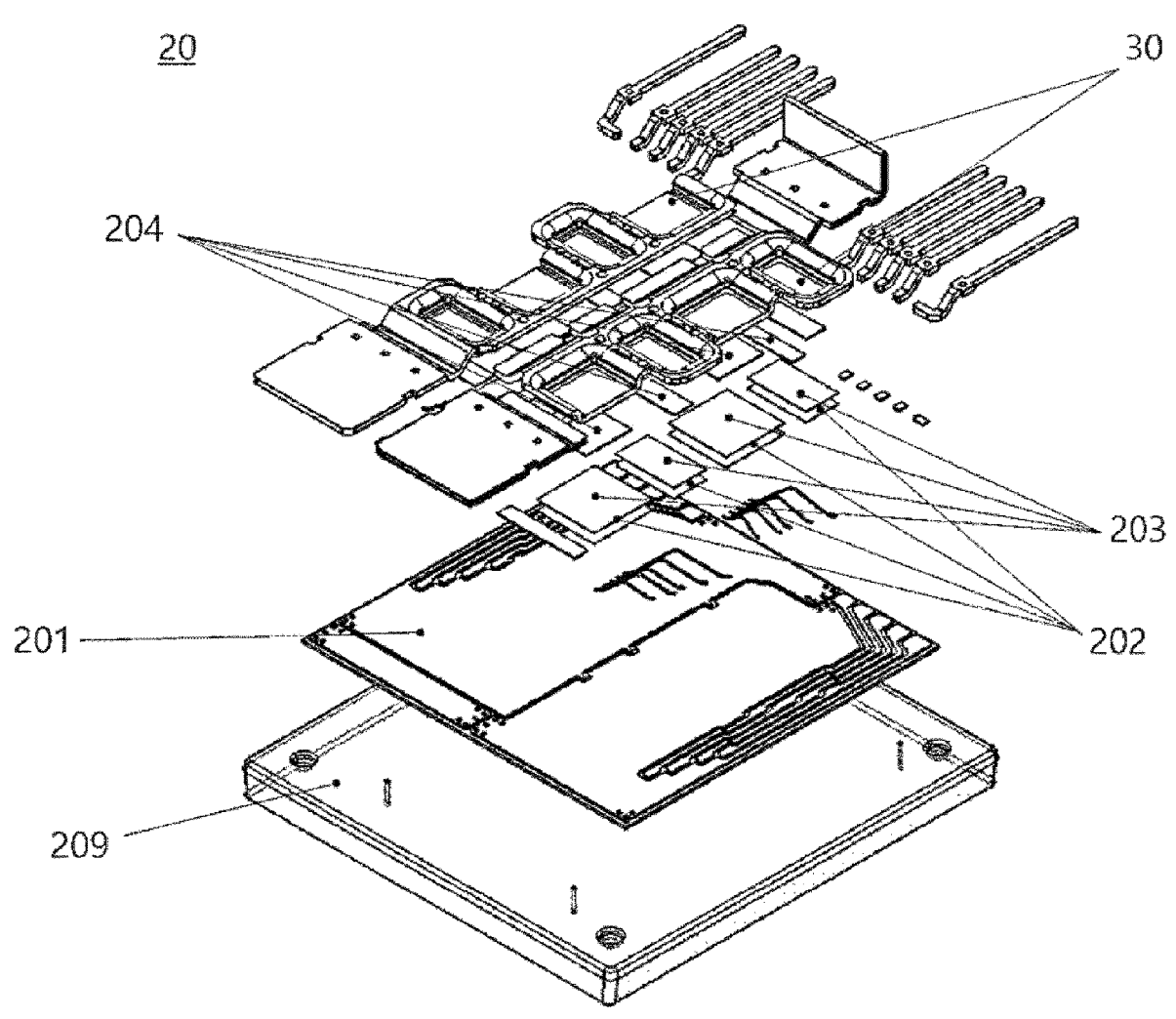
FIG. 17 is an exploded perspective view of FIG. 16.

FIG. 16 is a perspective view of a power module according to an embodiment of the present invention, and FIG. 17 is an exploded perspective view of FIG. 16. The power module according to the present invention includes a circuit board 201, chips 203, and metal clips 30, chip solders 202 are disposed between the circuit board 201 and the chips 203, such that the circuit board 201 and the chips 203 are soldered to each other by the chip solders 202, and clip solders 204 are disposed between the chips 203 and the metal clips 30, such that the chips 203 and the metal clips 30 are soldered to each other by the clip solders 204.

The circuit board 201 is an insulating substrate on which metal circuits are formed and onto which electric components are attached, and may be a directed bonded copper (DBC) substrate.

The chips 203 are disposed on the circuit board 201. Each chip is an integrated circuit formed of a semiconductor, and corresponds to a bare chip. The chips may be disposed in a structure in which they are arranged in a row on the circuit board 201, and may be formed in a plurality of rows.

The metal clips 30 are disposed on the chips and correspond to a kind of metal plates connected to the chips 203. The metal clips 30 electrically connect the chips 203 to each other and at the same time, electrically connect the chips 203 and the circuit board 201 to each other. That is, current paths between the chips 203 and the circuit board 201 are formed through the metal clips 30.

In this case, the metal clip 30 dissipates heat of the chips 203. The heat of the chips is emitted in all directions, and heat transferred to an upper portion in the heat of the chips is dissipated through the metal clip 30.

In the related art, another circuit board is provided on the chips and metal spacers are put between another circuit board and the chip to dissipate heat, whereas in the present invention, another circuit board according to the related art is removed, the metal clips are applied, and a heat dissipation path is formed through the metal clips, and thus, the number of components and an assembling man-hour may be decreased as compared with the related art. More specifically, the power module according to the related art includes four types of mounted components such as a lower substrate, solders, chips, and a lead frame, and three types of mounted components such as an upper substrate, solders, and spacers, whereas the power module according to the present invention includes four types of mounted components such as a substrate, solders, chips, and a lead frame to have a very simple structure, and thus, the number of components and an assembling man-hour may be decreased as compared with the related art, such that a manufacturing process of the power module may be simplified and a manufacturing yield of the power module may be improved.

The metal clip 30 may be formed of copper (Cu). Since copper has a high conductivity, it may improve heat dissipation performance of the power module due to its excellent heat dissipation properties, and may lower a manufacturing cost of the power module due to its low cost.

Referring to FIG. 16 again, the metal clips 30 may include extension parts formed to extend from the metal clip 30 and in contact with an upper surface of the circuit board 201. Since the metal clips include the extension parts as described above, the heat transferred to the metal clips is transferred to the circuit board, such that heat dissipation performance may be improved. As described above, the heat transferred to the circuit board may be dissipated through the heat sink.

In addition, at least one of both end portions of the metal clip 30 may be coupled to a lead frame 221. Since the lead frame 221 has a structure in which at least a portion thereof is exposed to the outside, the heat transferred to the metal clip 30 is transferred to the lead frame 221 and dissipated to the outside, such that heat dissipation performance may be improved.

Referring back to FIG. 16, the power module according to the present invention further includes a molding part 209 for molding the mounted components, that is, the circuit board 201, the chips 203, the metal clips 30, and the like. In this case, the upper portion of the circuit board 201 is occluded by the molding part 209. That is, in the related art, the heat transferred from the chip to the upper portion is dissipated through the upper substrate, and thus, the upper substrate is exposed to the outside, whereas in the present invention, the heat transmitted from the chip to the upper portion is dissipated by the metal clip or is transferred to and dissipated by the lower substrate and the lead frame through the metal clip, and thus, the upper portion does not need to be exposed, and accordingly, the upper portion of the molding part 209 may be occluded. As described above, since the molding part is configured to cover all of the upper portions of the mounted components, protection performance of the mounted components from the outside by the molding part may be increased, and structural robustness of the power module may be improved.

Referring to FIGS. 16 and 17 again, each of the chip solders 202 and the clip solders 204 is configured as a preform solder. In this case, the chip solder 202 and the clip solder 204 have the same melting point. That is, the chip solder 202 and the clip solder 204 are configured as the same solder. In addition, the chip solders 202 and the clip solders 204 are fused simultaneously in one process, such that the circuit board 201 and the chips 203, and the chips 203 and the metal clips 30 are simultaneously soldered to each other.

As described above, the power module according to the present invention is manufactured by using the same solders in order to solder the respective components to each other and soldering the respective solders at the same time and in an integrated manner, and thus, the number of soldering processes may be decreased as compared with the related art in which each of the lower substrate and the upper substrate is primarily soldered to the mounted components, and the primarily soldered lower substrate and upper substrate are secondarily soldered to each other, such that a manufacturing process may be simplified. In addition, as the number of soldering processes is decreased, a predetermined defective rate occurring in each soldering process is also decreased, such that a manufacturing yield of the power module may be improved.

A specific embodiment of the present power module will be described below with reference to FIGS. 16 and 17 again. The chips include first-row chips including a plurality of chips arranged in a row and second-row chips including a plurality of other chips arranged in a row, and the metal clip may include a first metal clip disposed on the first-row chips and electrically connecting the first-row chips to each other and a second metal clip disposed on the second-row chips and electrically connecting the second-row chips to each other.

In addition, the first metal clip may include an extension part formed to extend from one side of the first metal clip and in contact with the upper surface of the circuit board, and at least one of both end portions of the second metal clip may be in direct contact with the lead frame. In this case, the extension part of the first metal clip may be formed between the first metal clip and the second metal clip spaced apart from each other. As described above, the extension portion is formed between the first metal clip and the second metal clip, which may directly or indirectly assist in heat dissipation of the first metal clip and the second metal clip.

<Power Module Soldering Jig and Soldering Method>

Figure 18:
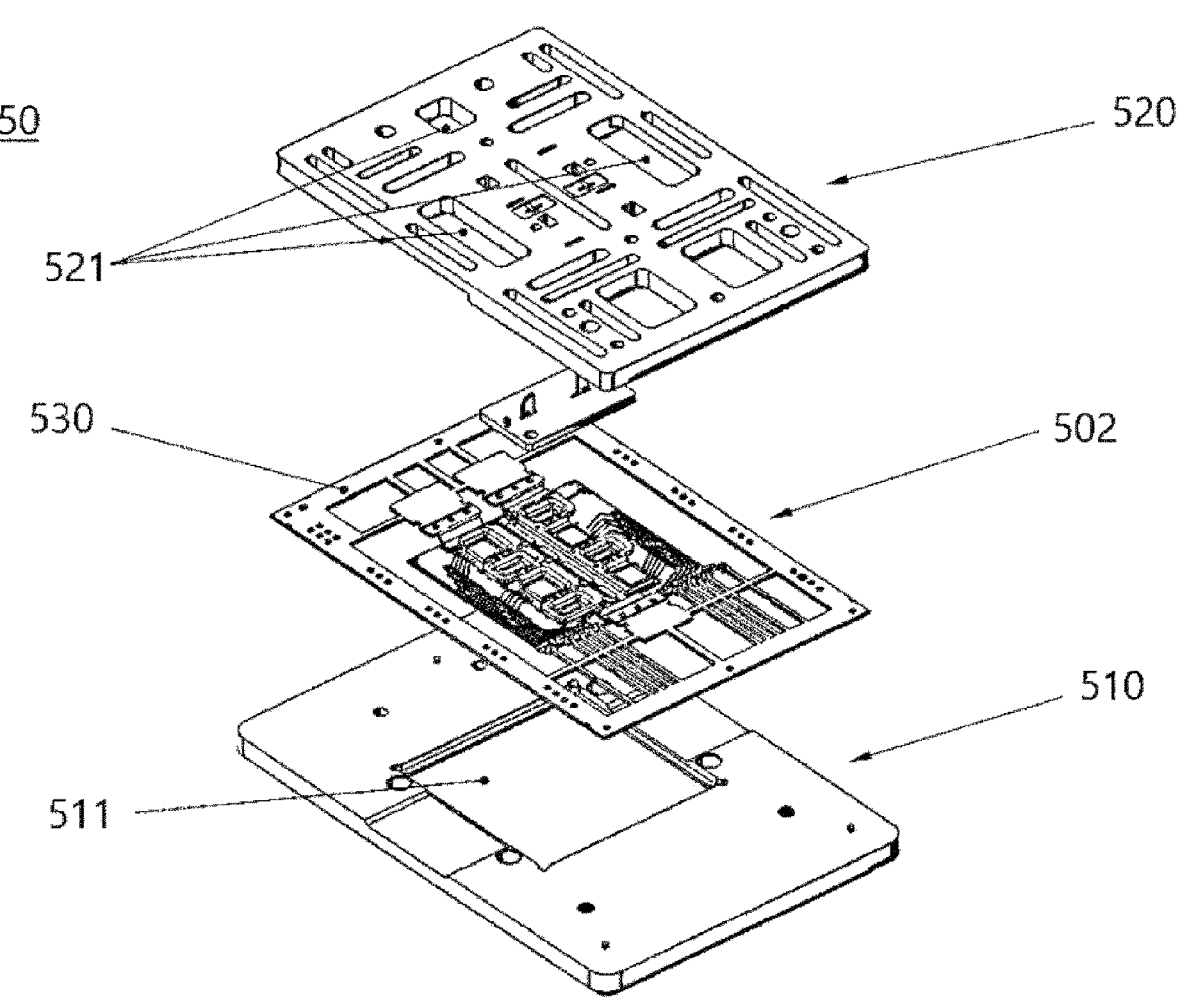
FIG. 18 is an exploded perspective view of a power module soldering jig according to an embodiment of the present invention.
Figure 19:
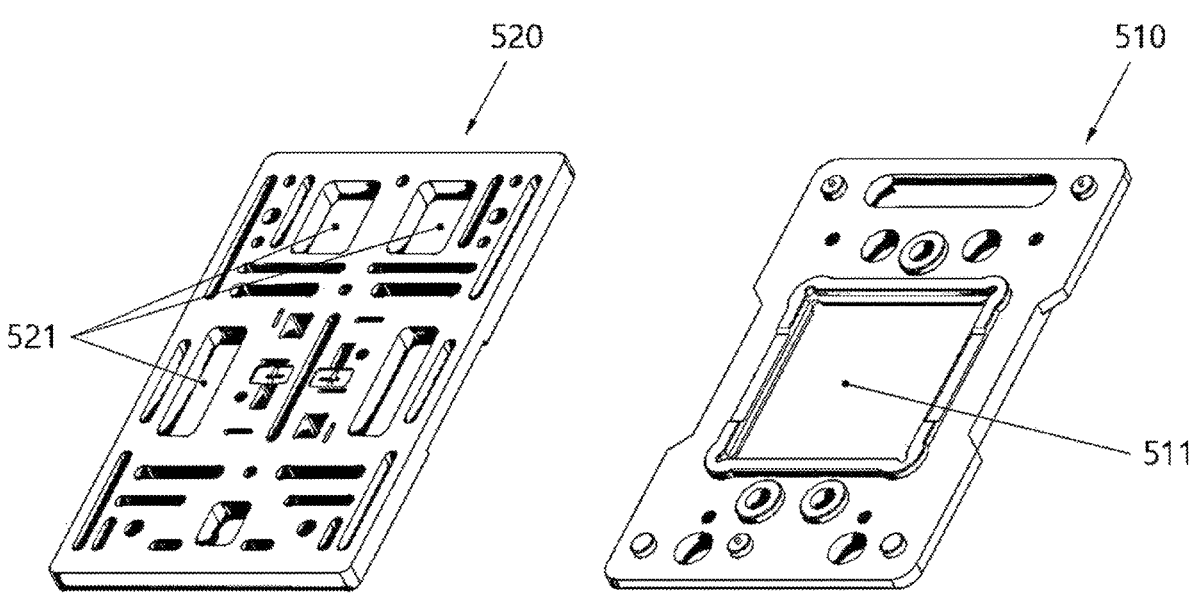
FIG. 19 is views illustrating an upper jig and a lower jig, respectively.
Figure 20:
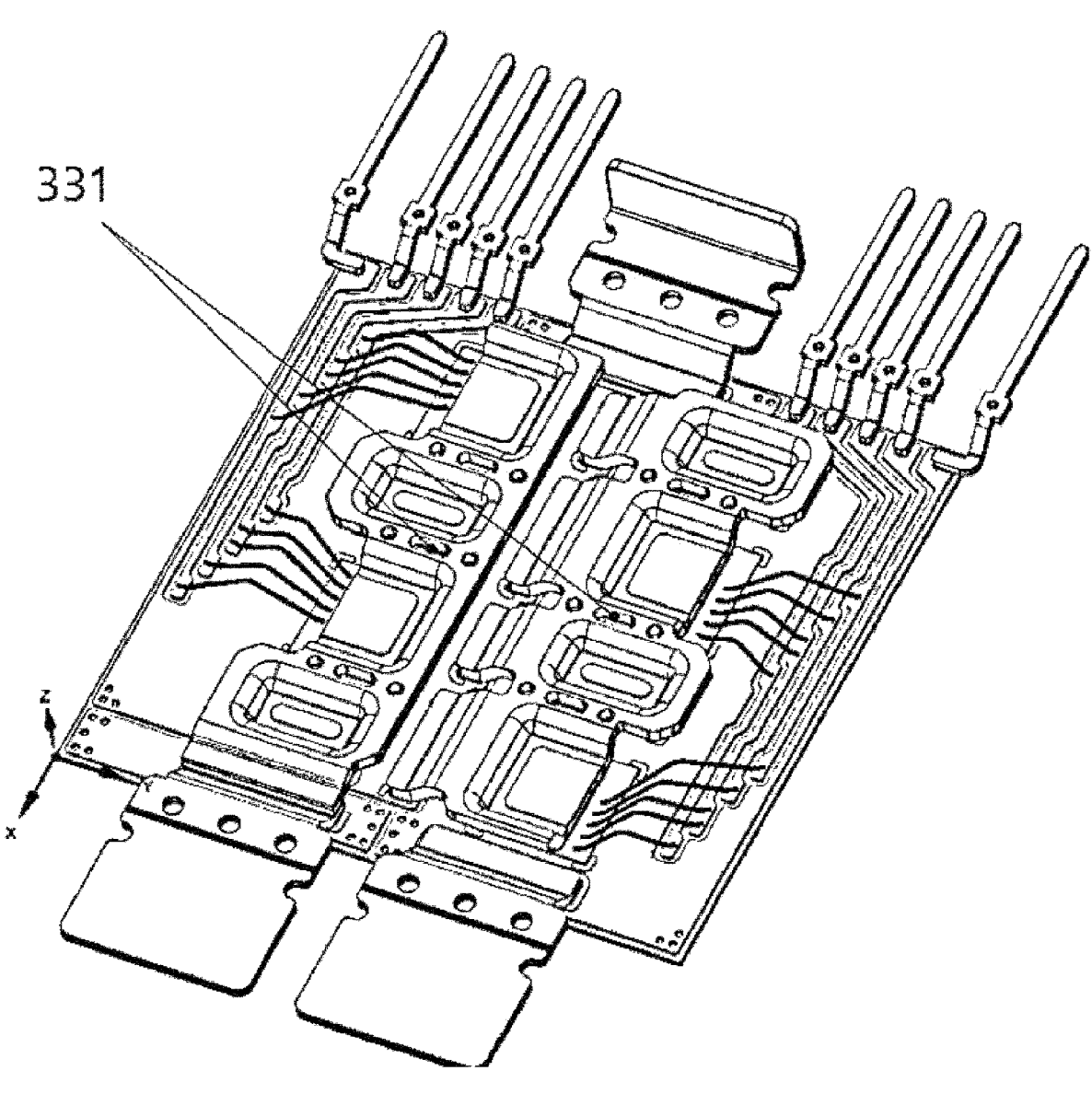
FIG. 20 is a view illustrating a power module manufactured through the soldering jig.

FIG. 18 is an exploded perspective view of a power module soldering jig according to an embodiment of the present invention, and FIG. 19 is views illustrating an upper jig and a lower jig, respectively. As illustrated in FIGS. 18 and 19, a soldering jig 50 includes a lower jig 510 and an upper jig 520. In addition, FIG. 20 is a view illustrating a power module manufactured through the soldering jig, and corresponds to internal components of the power module before the molding part 209 is provided.

A structure 502 including a circuit board 201, a chip solder 202, chips 203, and a clip solder 204 is seated on the lower jig 510. The structure 502 may further include an external frame 530 for fixing the circuit board 201 and the lead frame 221, and may be seated on the lower jig 510 in a state in which the respective components are fixed to the external frame 530. A seating groove 511 may be formed in the center of the lower jig 510 so that the circuit board may be mounted on the lower jig 510.

The upper jig 520 is fastened to the lower jig 510, and the metal clip 30 is fixed to a lower portion of the upper jig 520. As described above, the metal clip 30 is fixed to the upper jig 520, and thus, a position of the metal clip 30 in a vertical direction is fixed by the upper jig.

More specifically, a lower portion of the upper jig 520 includes a ring (not illustrated) protruding downward, the metal clip 30 includes a ring groove 331 to which the ring of the upper jig may be hooked, and the metal clip 30 is hung on and fixed to the upper jig 520 using the ring. The ring groove 331 of the metal clip may correspond to some of through holes 330 penetrating through the metal clip 30, and these through holes 330 may function as passages through which a molding material flows later. More detailed contents thereof will be described later.

In such a jig configuration, when the upper jig 520 to which the metal clip 30 is fixed is fastened to the lower jig 510 on which the structure 502 is seated, the upper jig 520 correctly positions the metal clip 30 at a position spaced apart from the chips 203 in a gravity direction.

That is, with the present device, when soldering the metal clip to upper portions of the chips using the preform solder, the metal clip is not seated on the upper portions of the chips by gravity, but a position of the metal clip in the vertical direction is fixed in a state in which the metal clip is hung on the upper jig. Accordingly, even though the solder is fused, the position of the metal clip in the vertical direction is fixed, and thus, it is possible to prevent the metal clip from being inclined, and it is possible to keep a thickness of the soldering part constant, such that a power module of a certain standard may be manufactured.

Meanwhile, at the time of a soldering process, heat loss may occur through the upper jig and the lower jig, and the upper jig and the lower jig may also be expanded by heat to be thermally deformed. In order to solve such a problem, the present invention adopts the following configuration.

Referring to FIGS. 18 and 19 again, the upper jig has a plurality of punched parts 521 formed to penetrate through the upper jig. Accordingly, heat dissipated through the upper jig may be minimized, a manufacturing cost of the upper jig may be decreased, and structural robustness of the upper jig may be improved.

In addition, in order to prevent thermal deformation of the power module, each of the upper jig and the lower jig may be formed of a material having a low coefficient of thermal expansion and having a high mechanical strength. Specifically, each of the upper jig and the lower jig may have a coefficient of thermal expansion of 17 ppm/° C. or less and a tensile strength of 300 MPa or more.

Furthermore, a volume may be optimized in order to increase heat transfer efficiency conducted from a lower portion, and as a preferable example, the lower jig may be manufactured to have a volume 15 times or more the volume of the power module.

Figure 21:
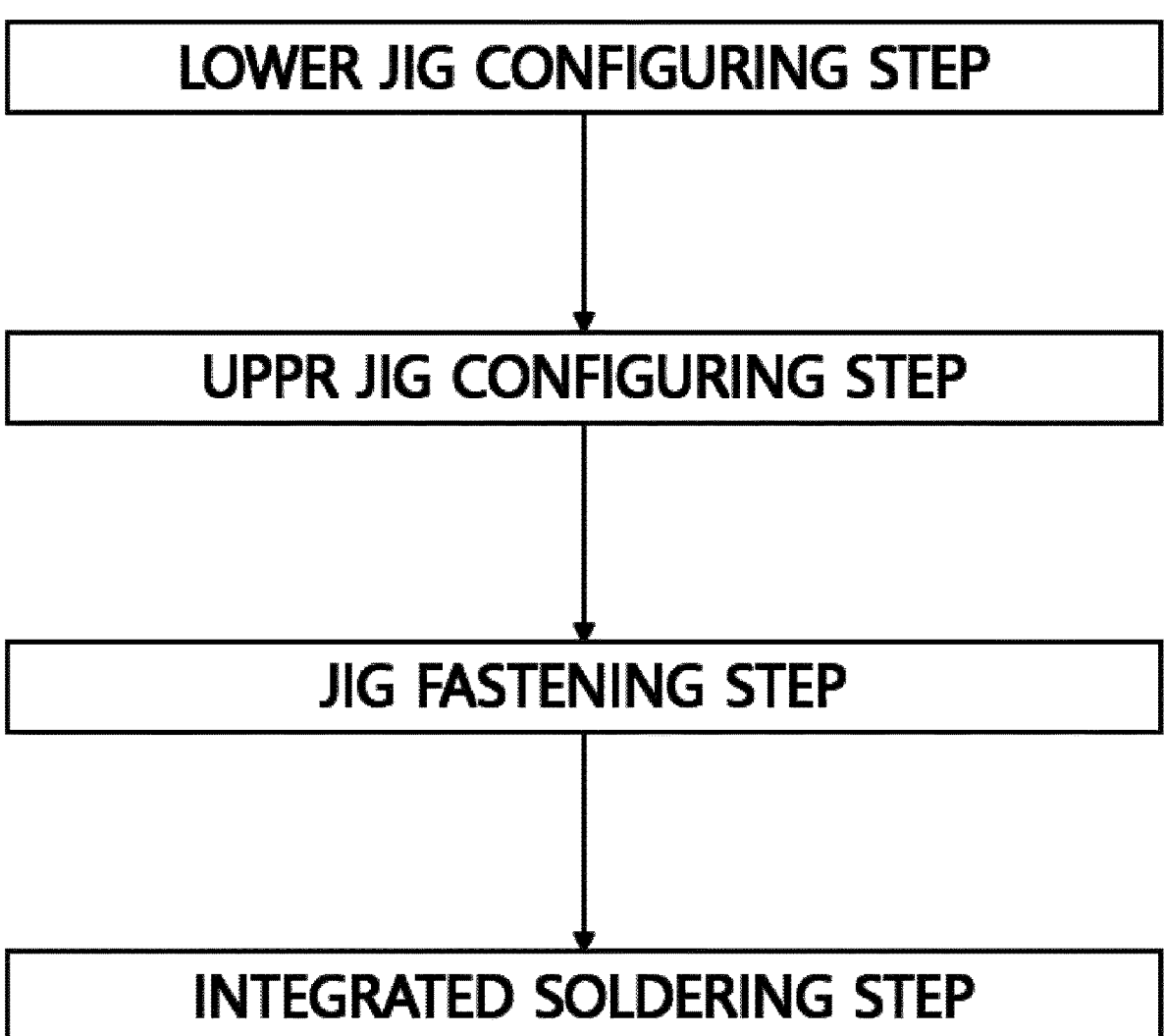
FIG. 21 is a flowchart of a power module soldering method according to an embodiment of the present invention.

FIG. 21 is a flowchart of a power module soldering method according to an embodiment of the present invention. The soldering method according to an embodiment of the present invention includes a lower jig configuring step, an upper jig configuring step, a jig fastening step, and an integrated soldering step.

In the lower jig configuring step, the circuit board, the chip solder, the chips, and the clip solder are sequentially stacked on the lower jig. In the upper jig configuring step, the metal clip is fixed to the lower part of the upper jig. In the jig fastening step, the lower jig and the upper jig are fastened to each other. In addition, in the integrated soldering step, the chip solder and the clip solder are soldered simultaneously in one process. Here, the order of the lower jig configuring step and the upper jig configuring step may be changed.

Furthermore, in the lower jig configuring step, a lead frame solder and the lead frame may be further sequentially stacked on one side of the circuit board, and a pin solder and signal pins may further be sequentially stacked on the other side of the circuit board. In this case, in the integrated soldering step, the lead frame solder and the pin solder may be simultaneously soldered together with the chip solder and the clip solder in one process.

With the soldering method according to an embodiment of the present invention described above, all the solders in the power module are simultaneously soldered in one process, such that a manufacturing process of the power module may be simplified and a manufacturing yield of the power module may be significantly improved.

<Molding Part Manufacturing Mold of Power Module>

Referring to FIG. 20 again, a product of FIG. 20 is internal components of the power module in which mounted components of the power module are soldered through a soldering process, and a power module of a final product is manufactured by forming the molding part 209 for protecting the internal components. The molding part 209 corresponds to a housing or cover accommodating and protecting the internal components.

Figure 22:
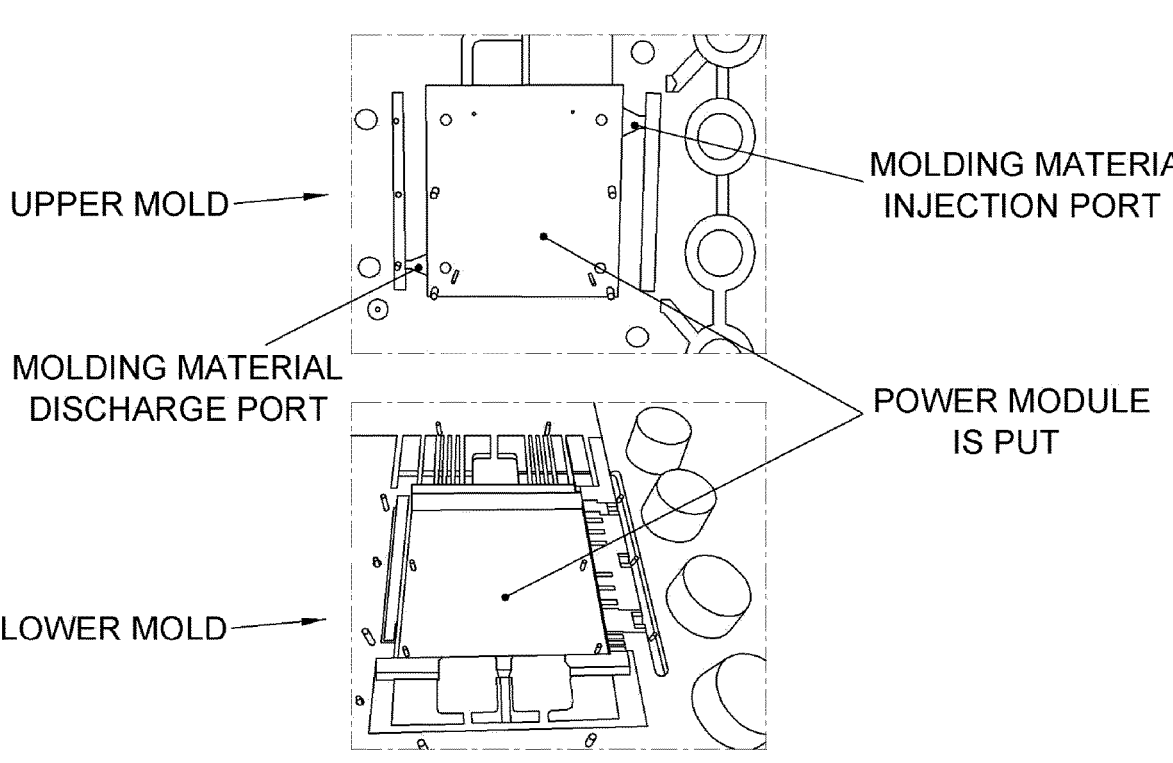
FIG. 22 is views illustrating a molding part manufacturing mold according to the related art.

FIG. 22 is views illustrating a molding part manufacturing mold according to the related art, and illustrates an upper mold and a lower mold. In the molding part manufacturing mold according to the related art, a molding material injection port and a molding material discharge port are formed as an intaglio in the upper mold, and it is impossible to change an injection position and a discharge position of a molding material. Accordingly, when design structures of the internal components of the power module are changed, there is a problem that a mold should be newly manufactured by redesigning positions of an injection port and a discharge port suitable for the changed design structures. The change in the design structures of the internal components of the power module may mean a change in a size of the power module, a change in positions of the internal components, a change in structures of the internal components, and the like.

Figure 23:
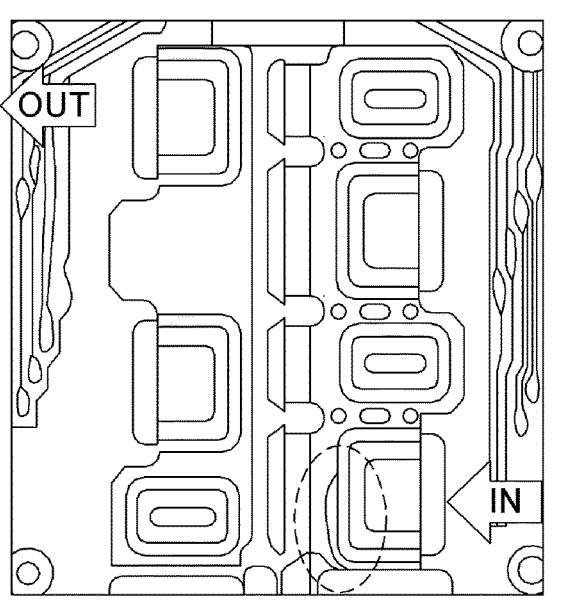
FIG. 23 is views illustrating whether or not a molding part is peeled according to an injection position and a discharge position of a molding material.
Figure 23:
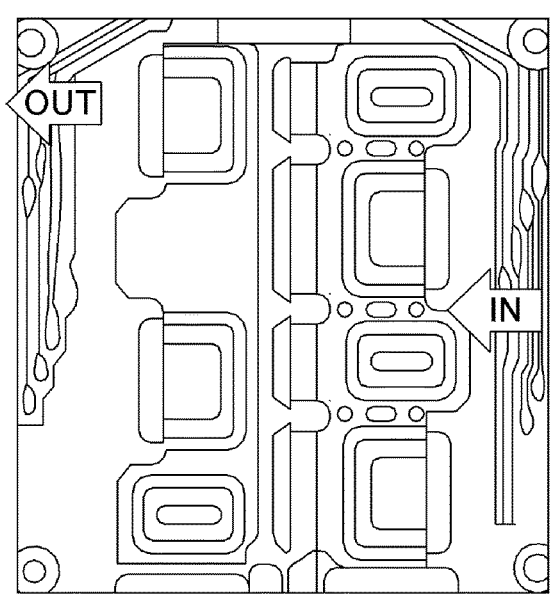

FIG. 23 is views illustrating whether or not a molding part is peeled according to an injection position and a discharge position of a molding material. In a left drawing of FIG. 23, an injection position of the molding material is positioned on the lower right side of the left drawing and a discharge position of the molding material is positioned on the upper left side of the left drawing. In this case, as indicated by dotted lines, the molding material is not uniformly dispersed between the internal components of the power module, such that peeling of the molding part occurs. In a right drawing of FIG. 23, an injection position of the molding material is positioned at the right center of the right drawing and a discharge position of the molding material is positioned on the upper left side of the right drawing. In this case, as illustrated in the right drawing of FIG. 23, the molding material is uniformly dispersed between the internal components of the power module, such that peeling of the molding part does not occur. As described above, there is an injection position and a discharge position of the molding material optimized for each of the design structures of the internal components of the power module. To the end, injection and discharge positions of the molding part need to be appropriately designed according to the design structures of the internal components of each power module. However, as described above, the molding part manufacturing mold according to the related art is manufactured in a form in which the molding material injection port and the molding material discharge port are fixed, and thus, it is impossible to change positions of the molding material injection port and the molding material discharge port.

The present invention has been made in an effort to solve such a problem, and provides a molding part manufacturing mold in which positions of a molding material injection port and a molding material discharge port may be changed.

Figure 24:
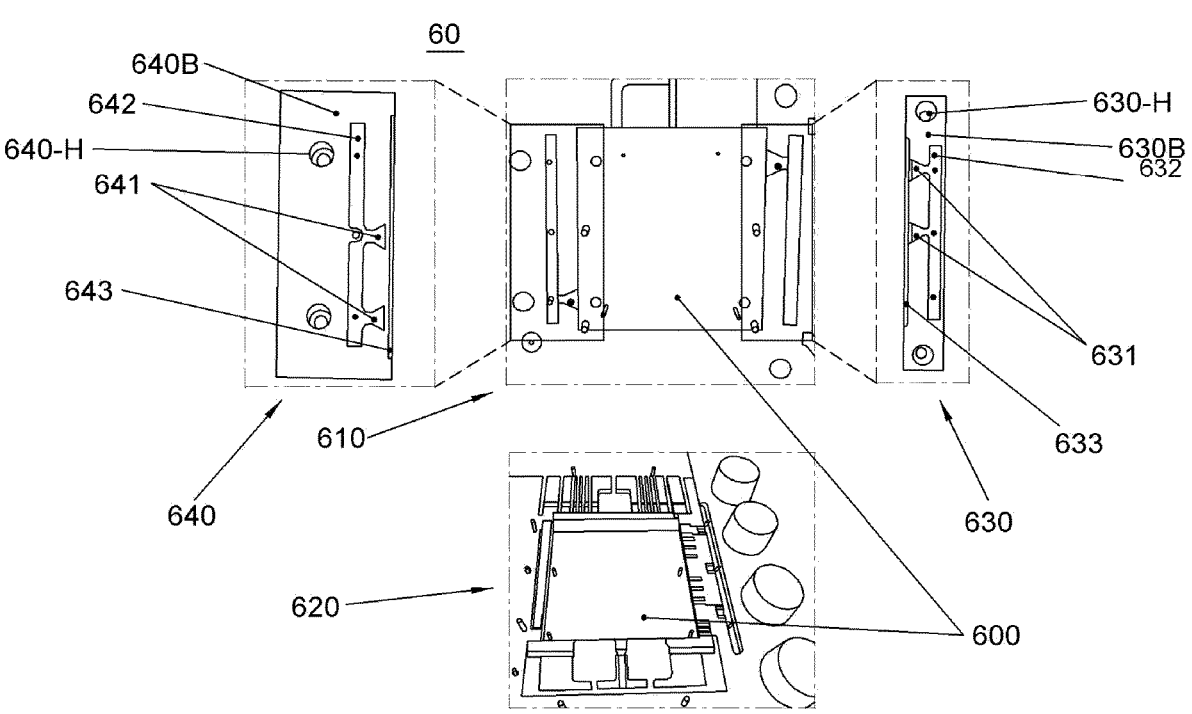
FIG. 24 is a view illustrating a molding part manufacturing mold according to an embodiment of the present invention.

FIG. 24 is a view illustrating a molding part manufacturing mold according to an embodiment of the present invention. The molding part manufacturing mold 60 according to an embodiment of the present invention includes an upper mold 610 and a lower mold 620, and further includes an injection part mounting mold 630 and a discharge part mounting mold 640.

The upper mold 610 and the lower mold 620 are stacked and fastened to each other to form a molding space 600 into which the internal components of the power module are put therebetween. A molding material is injected into the molding space 600 into which the internal components are put, such that the molding part of the power module is manufactured. The molding material may be an epoxy molding compound (EMC).

The injection part mounting mold 630 is mounted in a first mounting groove (not illustrated) formed inside the upper mold 610 or the lower mold 620, and includes one or more injection ports 631 injecting the molding material into the molding space 600. That is, a mounting groove into which the injection part mounting mold may be inserted and mounted is formed in the upper mold or the lower mold, and the injection part mounting mold 630 is inserted and mounted into the mounting groove. The injection part mounting mold 630 is detachably mounted in the first mounting groove. FIG. 24 illustrates that the mounting groove is formed in the upper mold and the injection part mounting mold is mounted in the mounting groove.

The discharge part mounting mold 640 is mounted in a second mounting groove (not illustrated) formed inside the upper mold 610 or the lower mold 620, and includes one or more discharge ports discharging the molding material injected into the molding space. That is, a mounting groove into which the discharge part mounting mold may be inserted and mounted is formed in the upper mold or the lower mold, and the discharge part mounting mold is inserted and mounted into the mounting groove. The discharge part mounting mold 640 is detachably mounted in the second mounting groove. FIG. 24 illustrates that the mounting groove is formed in the upper mold and the discharge part mounting mold is mounted in the mounting groove.

Figure 25:
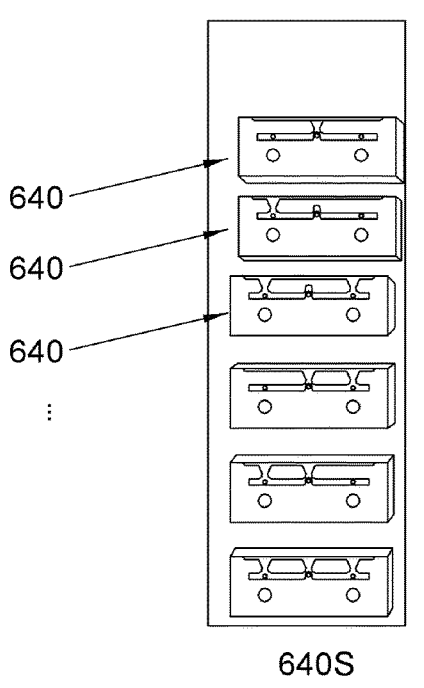
FIG. 25 is views illustrating an injection part mounting mold set and a discharge part mounting mold set.
Figure 25:
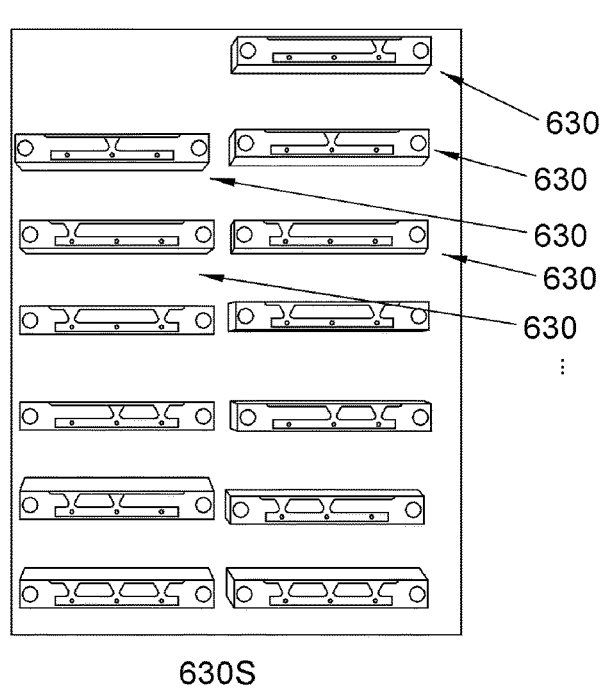

The injection part mounting mold 630 is one injection part mounting mold in an injection part mounting mold set 630S including various types of injection part mounting molds 630 having different injection port structures, and the discharge part mounting mold 640 is one discharge part mounting mold in a discharge part mounting mold set 640S including various types of discharge part mounting molds 640 having different discharge port structures. FIG. 25 is views illustrating an injection part mounting mold set and a discharge part mounting mold set. As illustrated in FIG. 25, the injection part mounting molds 630 of the injection part mounting mold set 630S are formed so that at least one of positions, the numbers, and sizes of injection ports 631 are different from each other, and the discharge part mounting molds 640 of the discharge part mounting mold set 640S are formed so that at least one of positions, the numbers, and sizes of discharge ports 641 are different from each other. More detailed contents thereof will be described later.

In addition, any one of the injection part mounting molds 630 of the injection part mounting mold set 630S is mounted in the first mounting groove, and any one of the discharge part mounting molds 640 of the discharge part mounting mold set 640S is mounted in the second mounting groove. Accordingly, an injection position at which the molding material is injected into the molding space 600 and a discharge position at which the molding material is discharged from the molding space may be freely changed.

That is, as compared with the molding part manufacturing mold according to the related art in which the positions of the molding material injection port and the molding material discharge port are fixed and may not be changed, the molding part manufacturing mold according to the present invention is manufactured so that the injection position and the discharge position of the molding material may be freely changed by separately manufacturing an injection part mold and a discharge part mold and mounting each of the injection part mold and the discharge part mold on the upper mold or the lower mold. Accordingly, the molding part manufacturing mold according to the present invention may easily cope with changes in designs of the internal components of the power module of various structures, such that utilization efficiency of the molds may be increased, and a degree of freedom of the changes in the designs of the internal components of the power module may be secured without considering the molding part manufacturing mold.

Here, the injection part mounting mold 630 may be inserted into and bolted to the first mounting groove, and the discharge part mounting mold 640 may be inserted into and bolted to the second mounting groove. To this end, bolting holes 630-H and 640-H may be formed in the injection part mounting mold and the discharge part mounting mold, respectively. The injection part mounting mold and the discharge part mounting mold may be easily and firmly fixed to bolting holes through the bolting.

Hereinafter, a specific embodiment of the molding part manufacturing mold will be described.

Referring to FIG. 24 again, the injection part mounting mold 630 has a structure in which the injection ports 631 are formed as an intaglio on a mold body 630B, and the discharge hole mounting mold 640 has a structure in which the discharge ports 641 are formed as an intaglio on a mold body 640B.

The molding space 600 has a rectangular shape, the injection part mounting mold 630 has a shape in which it extends to be elongated along one side surface (right side surface in FIG. 24) of the molding space 600, and the discharge hole mounting mold 640 has a shape in which it extends to be elongated along the other side surface (left side surface in FIG. 24) of the molding space 600. In addition, the injection part mounting mold 630 and the discharge part mounting mold 640 are disposed to face each other with the molding space 600 interposed therebetween. As described above, the injection part mounting mold and the discharge part mounting mold are disposed to face each other, such that the injection position and the discharge position of the molding material are disposed to face each other, which is preferable in terms of fluidity of the molding material in the molding space.

Referring to FIG. 24 again, a collection groove 632 which is formed to be elongated as an intaglio along a length direction of the injection part mounting mold 630 and in which the molding material provided from the outside is collected is formed at a place spaced apart from the molding space 600 in the injection part mounting mold 630, and a storage groove 642 which is formed to be elongated as an intaglio along a length direction of the discharge part mounting mold 640 and in which the molding material discharged to the outside is stored is formed at a place spaced apart from the molding space 600 in the discharge part mounting mold 640.

In addition, one side outer groove 633 which is formed to be elongated as an intaglio along the length direction of the injection part mounting mold 630 and of which a side surface facing one side surface of the molding space 600 directly communicates with one side surface of the molding space 600 is formed at a place close to the molding space 600 in the injection part mounting mold 630. In addition, the other side outer groove 643 which is formed to be elongated as an intaglio along the length direction of the discharge part mounting mold 640 and of which a side surface facing the other side surface of the molding space 600 directly communicates with the other side surface of the molding space 600 is formed at a place close to the molding space 600 in the discharge part mounting mold 640. These outer grooves 633 and 643 are formed in order to prevent injection pressures from being concentrated on the injection port 631 or the discharge port 641, and may prevent the molding material from flowing out due to the concentration of the injection pressures.

In addition, the injection port 631 has an outer side communicating with the collection groove 632 and an inner side communicating with one side outer groove 633, and the discharge port 641 has an inner side communicating with the other side outer groove 643 and an outer side communicating with the storage groove 642. In this case, the injection port 631 has an inner diameter increasing from the outside to the inside, that is, as it becomes closer to the molding space 600, and the discharge port 641 has an inner diameter decreasing from the inside to the outside, that is, as it becomes more distant from the molding space 600. For example, each of the injection port and the discharge port may be formed in a triangular shape. This is advantageous in dispersing the injection pressures at the injection port and the discharge port.

Referring to FIG. 25 again, as described above, the injection part mounting mold set 630S and the discharge part mounting mold set 640S include various types of injection part mounting molds 630 and discharge part mounting molds 640, respectively. In this case, the injection part mounting mold 630 and the discharge part mounting mold 640 are formed so that positions, the numbers, sizes, and the like, of injection ports 631 and discharge parts 641 are different from each other, respectively. That is, a flow of the molding material in the molding space may be adjusted by freely changing the injection ports and the discharge parts, and as a result, molding optimized for the design structures of the internal components of each power module may be performed.

More specifically, the injection part mounting mold 630 includes one or two more injection ports 631, and each of the one or two more injection ports 631 is formed in one of the center of the injection part mounting mold 630 in the length direction, a position eccentric from the center to one side, and a position eccentric from the center to the other side. In addition, the discharge part mounting mold 640 includes one or two or more discharge ports 641, and each of the one or two or more discharge ports 641 is formed in one of the center of the discharge part mounting mold 640 in the length direction, a position eccentric from the center to one side, and a position eccentric from the center to the other side.

Simultaneously with or separately from this, the injection part mounting mold 630 includes two or more injection ports 631, and the two or more injection ports 631 are formed to have the same inner diameter or different inner diameters. In addition, the discharge part mounting mold 640 includes two or more discharge ports 641, and the two or more discharge ports 641 are formed to have the same inner diameter or different inner diameters.

That is, the injection part mounting mold and the discharge part mounting mold may be variously designed by making positions, sizes, the numbers, and the like of injection ports and discharge ports different from each other, respectively, and the molding part manufacturing mold may be modified and designed so as to be appropriate for the design structures of the internal components of the power module by appropriately combining and selecting any one of these various types of injection part mounting molds and any one of these various types of discharge part mounting molds with each other. Accordingly, it is possible to cope with power modules having various design structures, and it is possible to freely change the design regardless of the molding part manufacturing mold at the time of designing the power module.

<Metal Clip>

As described above, the metal clip is applied to the power module according to the present invention. Hereinafter, the metal clip will be described in detail.

Figure 26:
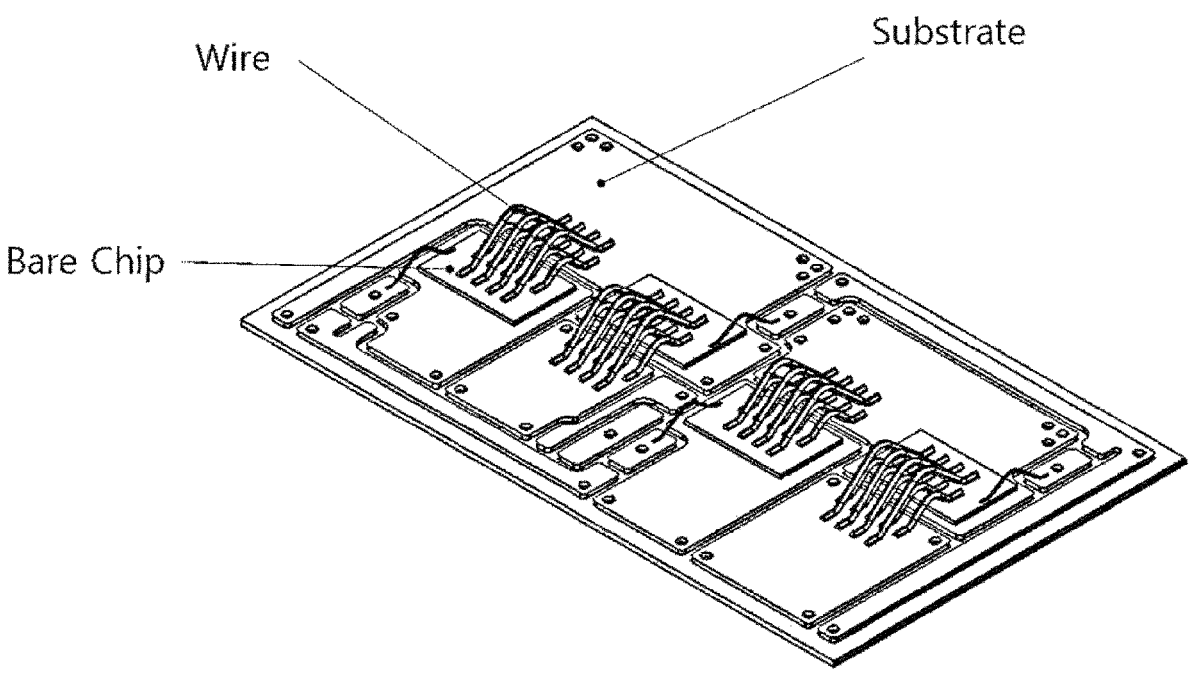
FIG. 26 is a view illustrating a connection structure between a substrate and a chip of the power module according to the related art.

FIG. 26 is a view illustrating a connection structure between a substrate and a chip of the power module according to the related art. As illustrated in FIG. 26, in the related art, a chip and a substrate are connected to each other through metal wires at the time of packaging the power module, and aluminum wires are generally used as the metal wires. In a case of connection through the aluminum wires, there are advantages such as a simple structure and a low cost, but there are problems such as relatively low bonding reliability, high thermal resistance, and high parasitic inductance, and furthermore, there is a problem that the number of wires required for a high current increases, such that it is difficult and a long process time is required to connect dozens of wires to each other.

The present invention has been made in an effort to solve such a problem, and provides a metal clip of a power module capable of improving thermal performance of the power module and securing structural stability of the power module by applying the metal clip instead of the wire according to the related art.

Figure 27:
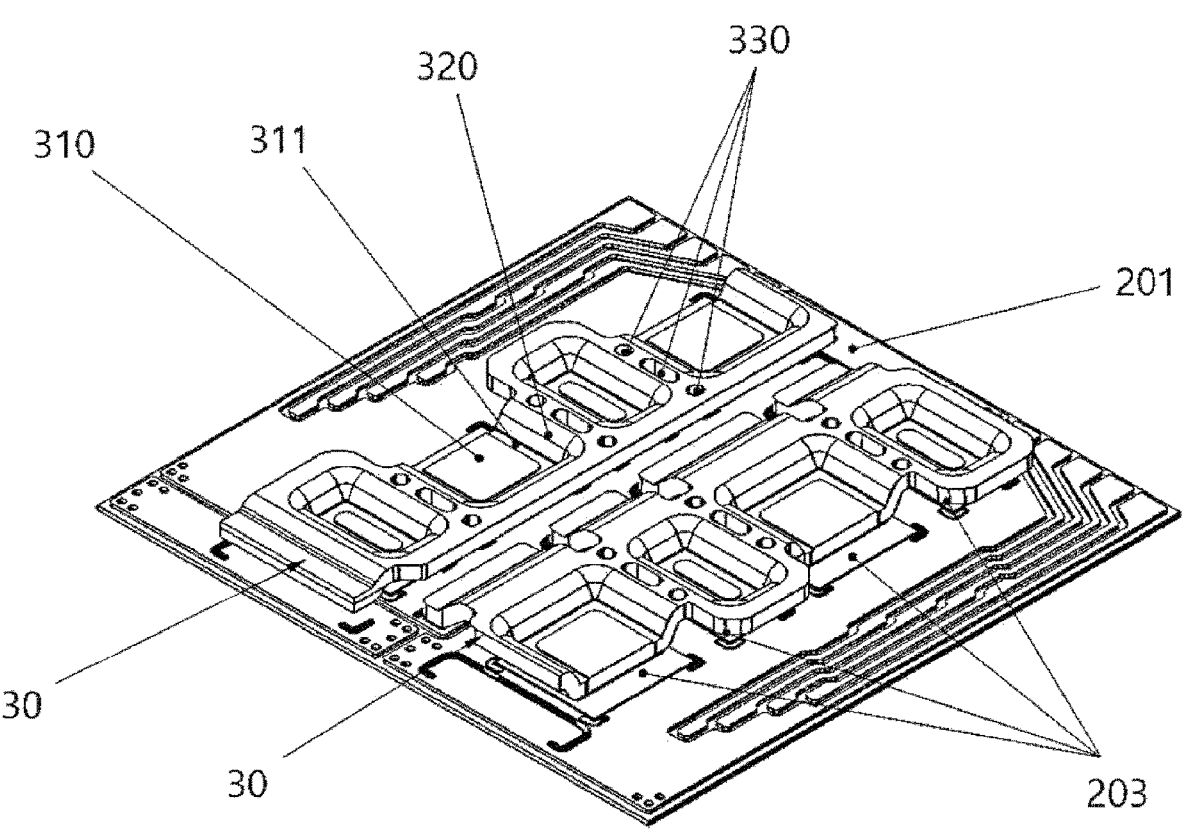
FIG. 27 is a view illustrating a connection structure between a board and a chip of the power module according to an embodiment of the present invention.

FIG. 27 is a view illustrating a connection structure between a board and a chip of the power module according to an embodiment of the present invention. As illustrated in FIG. 27, the metal clips 30 are disposed on and connected to the chips 203, and the chips 203 and the circuit board 201 are connected to each other through the metal clips 30. By applying the metal clips as described above, a bonding area with the chips is increased, such that efficient heat dissipation is achieved to decrease thermal resistance, bonding reliability between the metal clips and the circuit board is increased, and a current density is increased, and thus, a high current may flow. In addition, as compared with a wire bonding technology according to the related art, at the time of applying the metal clips, the chips and the board may be connected to each other at a time, such that a manufacturing process may be simplified, and the metal clips support the internal components of the power module, such that thermal deformation of the power module may be decreased.

Figure 28:
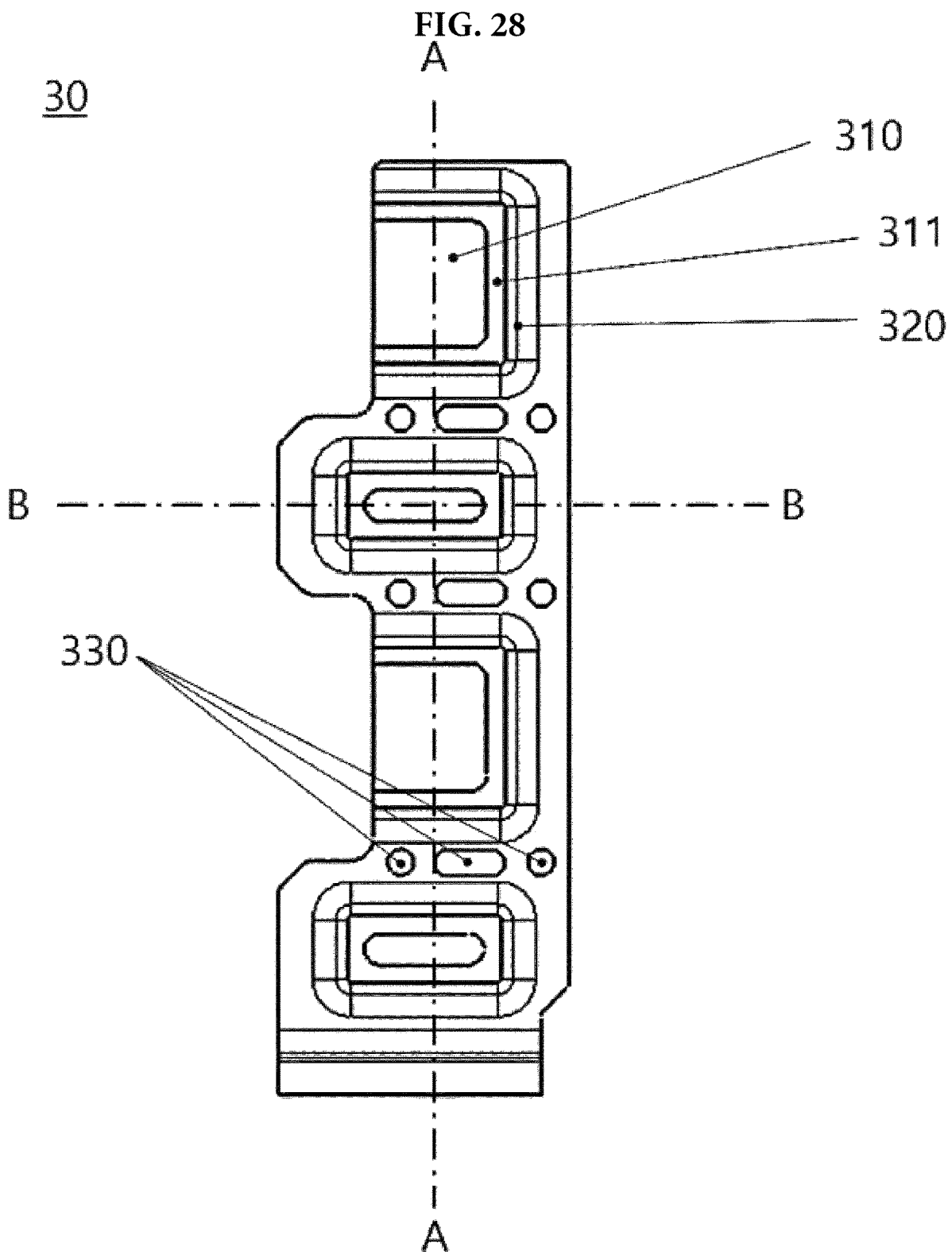
FIG. 28 is a top view of a metal clip according to an embodiment of the present invention.
Figure 29:
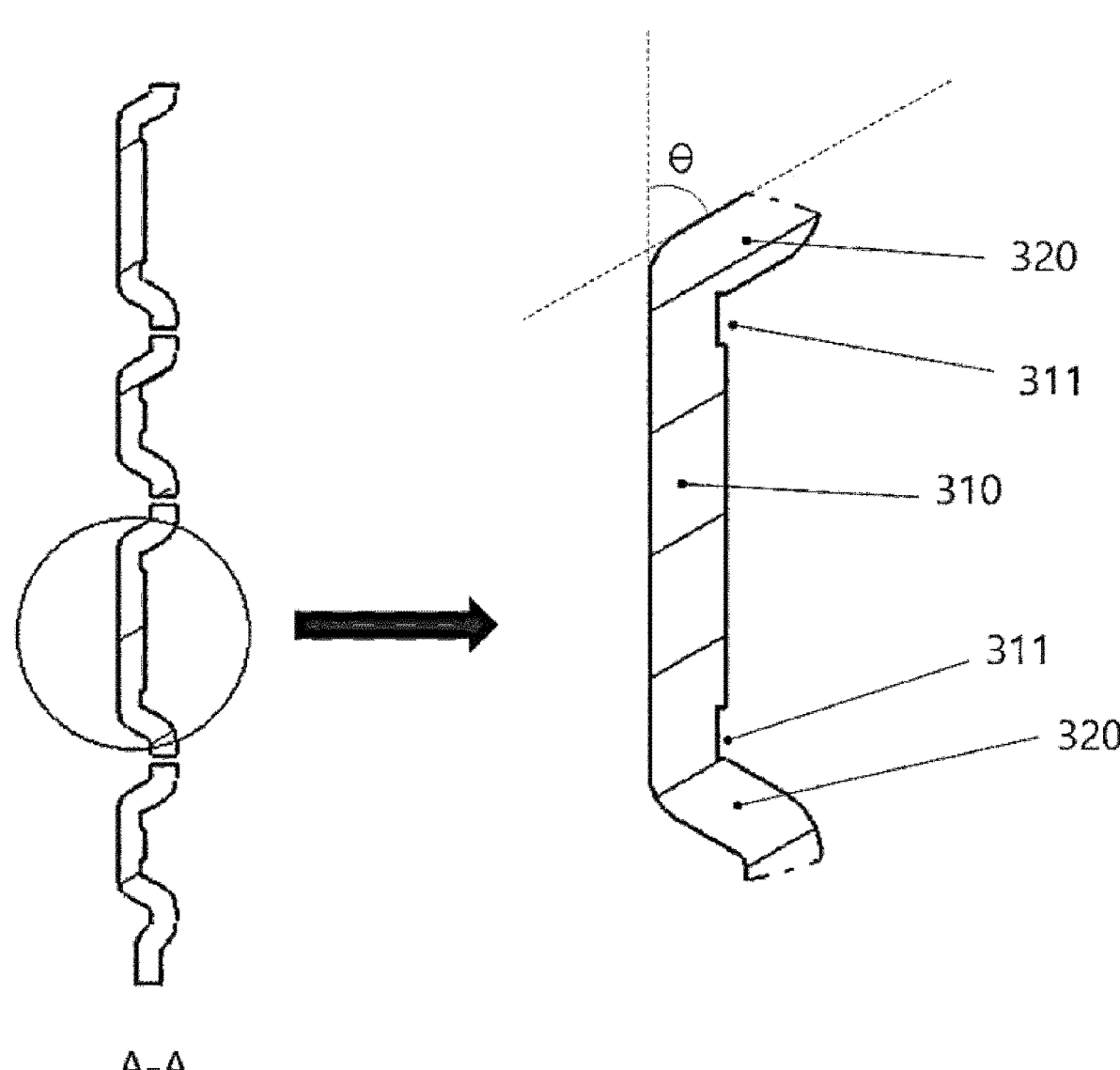
FIG. 29 is a cross-sectional view taken along line A-A of FIG. 28.
Figure 30:
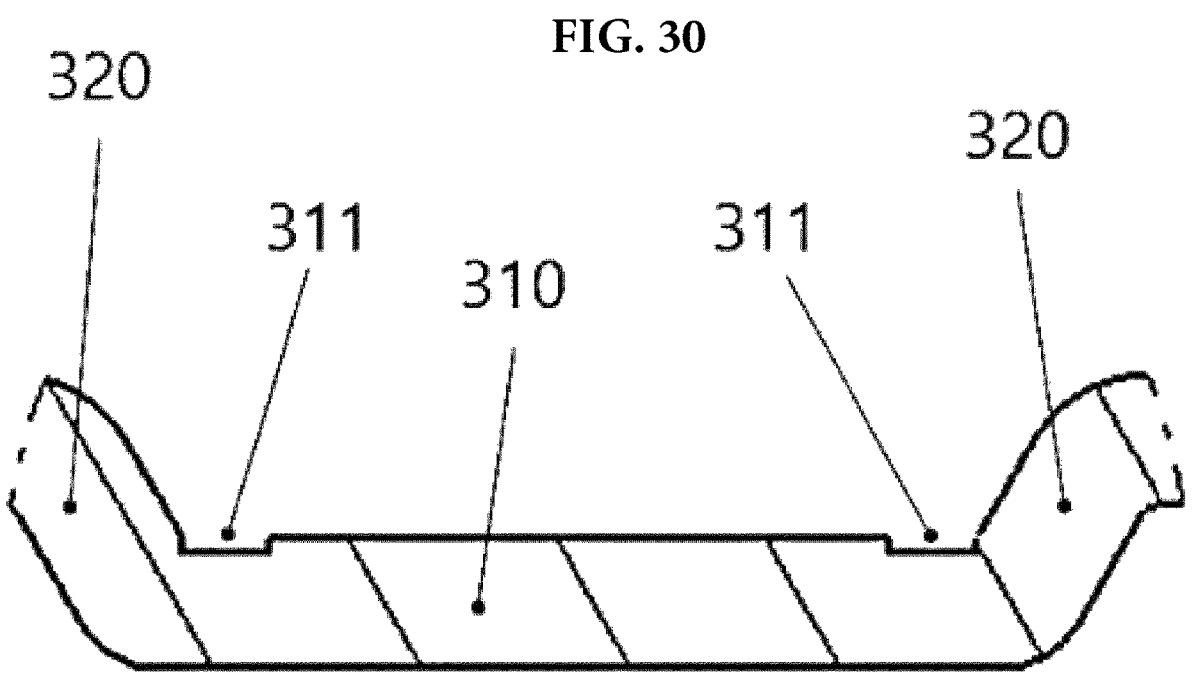
FIG. 30 is a cross-sectional view taken along line B-B of FIG. 28.
Figure 30:
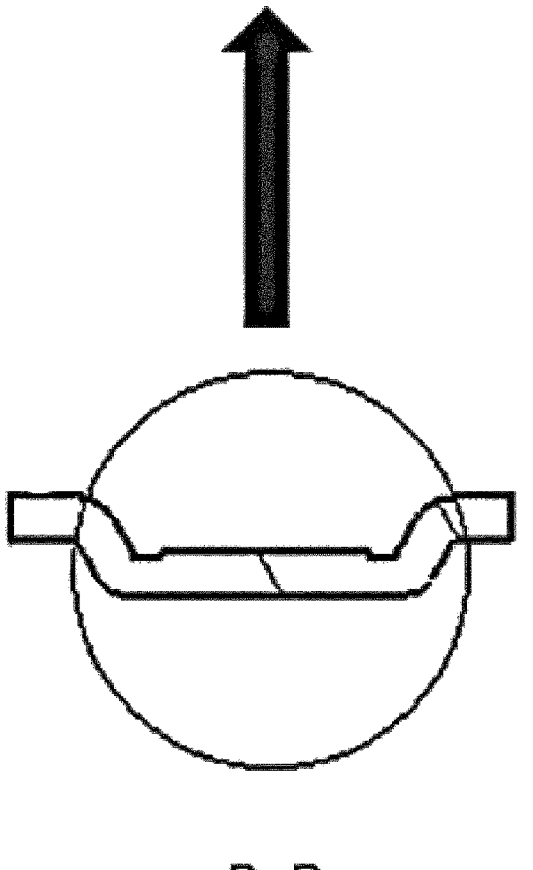

FIG. 28 is a top view of a metal clip according to an embodiment of the present invention, FIG. 29 is a cross-sectional view taken along line A-A of FIG. 28, and FIG. is a cross-sectional view taken along line B-B of FIG. 28. The metal clip 30 according to the present invention electrically connects the chips 203 of the power module 20 to each other, and includes a bonding part 310 and an outer side part 320.

A plurality of bonding parts 310 are provided to correspond to the respective chips, and a lower surface of each of the plurality of bonding parts 310 is bonded to an upper surface of each of the chips.

The outer side part 320 is formed to extend upward from at least a portion of an outer side of the bonding part 310 to have a step from the bonding part 310. That is, the outer side part 320 corresponds to a partition wall formed at the outer side part of the bonding part 310.

Here, a pressing groove 311 recessed inward is formed along a boundary between an upper surface of the bonding part 310 and the outer side part 320, on the upper surface of the bonding part 310. That is, the lower surface of the bonding part 310 corresponds to a bonding surface with the chip 203, and in order to maintain a height of the metal clip 30 at the time of soldering, the lower surface of the bonding part 310 should have a flatness of a predetermined level or higher. The metal clip according to the present invention has a structure in which a flatness is easily managed because an edge portion of the upper surface of each bonding part 310 is formed to be thin.

More specifically, the bonding part 310 and the outer side part 320 of the metal clip 30 have a structure in which a metal plate is bent. In this case, the metal clip 30 has a structure in which the outer side part 320 is bent at an edge of the bonding part 310, such that the center of the lower surface of the bonding part 310 may be convexly formed. This structure is disadvantageous for soldering, and thus, needs to be planarized.

Figure 31:
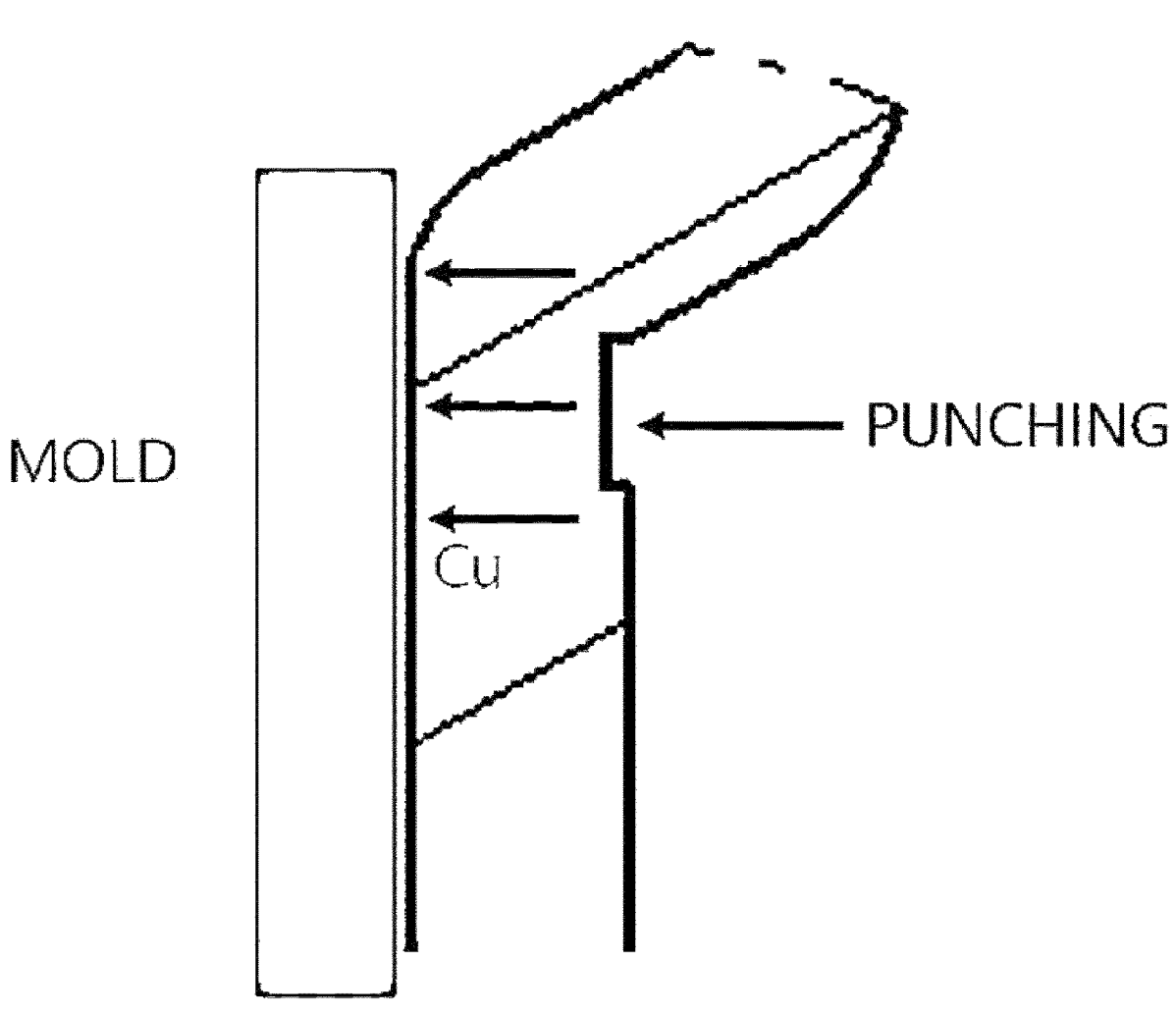
FIG. 31 is a view illustrating a bonding part punching process.

In order to make the lower surface of the bonding part 310 flat, the pressing groove 311 is formed at the edge of the bonding part 310. The pressing groove 311 of the bonding part 310 is formed through a punching process. FIG. 31 is a view illustrating a bonding part punching process. As illustrated in FIG. 31, in the bonding part 310, the pressing groove 311 is formed in the upper surface of the bonding part 310 by punching and pressing a region in which the pressing groove 311 of the bonding part 310 is formed, from above. In this process, a pressed metal structure (e.g., copper) is pushed toward a mold of the bonding surface, such that it becomes possible to secure a flatness of the bonding surface. That is, the lower surface of the bonding part 310 is formed to be flat, and accordingly, the height of the metal clip 30 at the time of soldering may be maintained as a desired height.

In addition, as described above, the metal clip 30 has the structure in which the metal plate is bent, and accordingly, the entire region of the metal plate is formed to have a constant thickness. That is, the bonding part 310 and the outer side part 320 are formed to have the same thickness. Furthermore, since the metal clip 30 has the structure in which the metal plate is bent, a lower portion of the outer side part 320 is formed as an empty space, and the outer side part 320 is bent at a predetermined angle from the bonding part 310 and extends upward. In this case, an angle A formed by a lower surface of the outer side part 320 and the lower surface of the bonding part 310 is smaller than a right angle.

Figure 32:
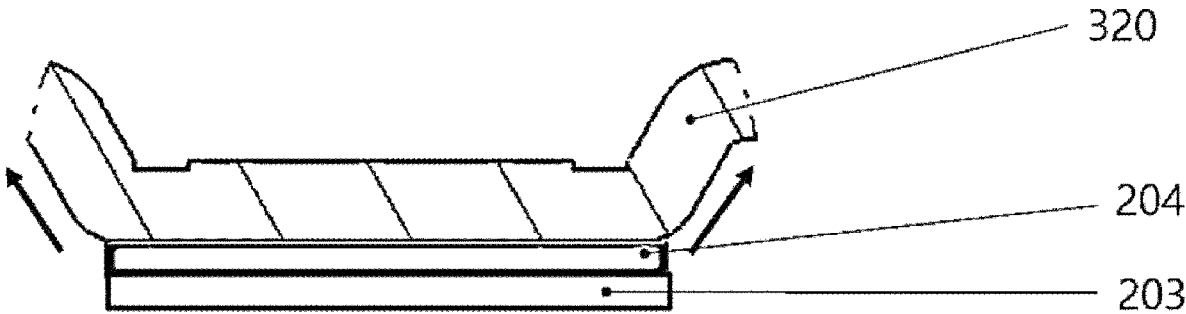
FIG. 32 is a view illustrating a flow of solder at the time of a soldering process.

FIG. 32 is a view illustrating a flow of solder at the time of a soldering process. As illustrated in FIG. 32, the clip solder 204 flows along the lower surface of the outer side part 320 by an adhesive force of the solder itself at the time of the soldering process. In this case, in the present invention, the outer side part 320 is bent at a predetermined angle, such that the solder may easily climb on the lower surface of the outer side part 320, and thus, wettability of the solder is improved, and the lower portion of the outer side part 320 is formed as the empty space, and the solder is stored in the empty space, such that it is possible to prevent the solder from overflowing an upper portion of the metal clip 30.

In addition, since the outer side part 320 has a structure in which it bent at a predetermined angle, the metal clip performs a support function when the power module is thermally deformed, which may assist in withstanding stress caused by thermal deformation.

Meanwhile, the chips positioned below the solder may also move along with the solder while the solder flows at the time of soldering. In the present invention, the outer side part 320 is formed in a symmetrical shape in order to prevent the chip from moving at the time of soldering. Accordingly, the solder flows symmetrically along the outer side part 320, such that amounts of movement of the solder from the center toward both sides are the same as each other, and thus, the movement of the chips at the time of the soldering may be prevented.

Specifically, referring to FIGS. 27 and 28 again, the bonding part 310 is formed in a rectangular shape when viewed from above, and the outer side parts 320 are formed at edges of the bonding part 310 in three directions among edges of the bonding part 310 in four directions or are formed at all of the edges of the bonding part 310 in the four directions. For passivation of the chips 203, the outer side part 320 may not be formed at an edge of the bonding part 310 in any one direction among the edges of the bonding part 310 in the four directions. In this case, the outer side parts 320 are formed to be symmetrical to each other with respect to the center of the bonding part 310 when the bonding part 310 is viewed from above. That is, the outer side parts 320 in each direction formed at an outer side of the bonding part 310 may have the same height and bending angle, and may be formed in a structure in which they are mirror-symmetrical to each other with respect to a center line of the chip in a direction perpendicular to a direction in which the chips are arranged.

Figure 33:
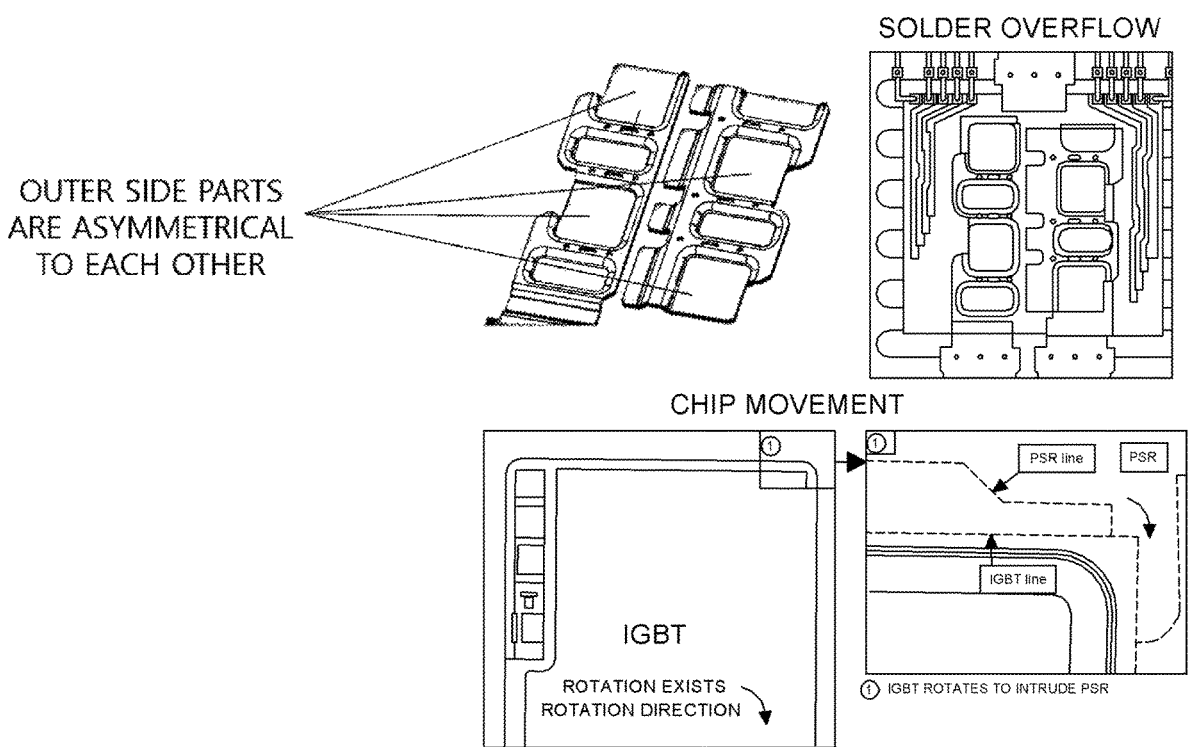
FIG. 33 is a view illustrating a soldered state when outer side parts are asymmetrically formed in the metal clip.
Figure 34:
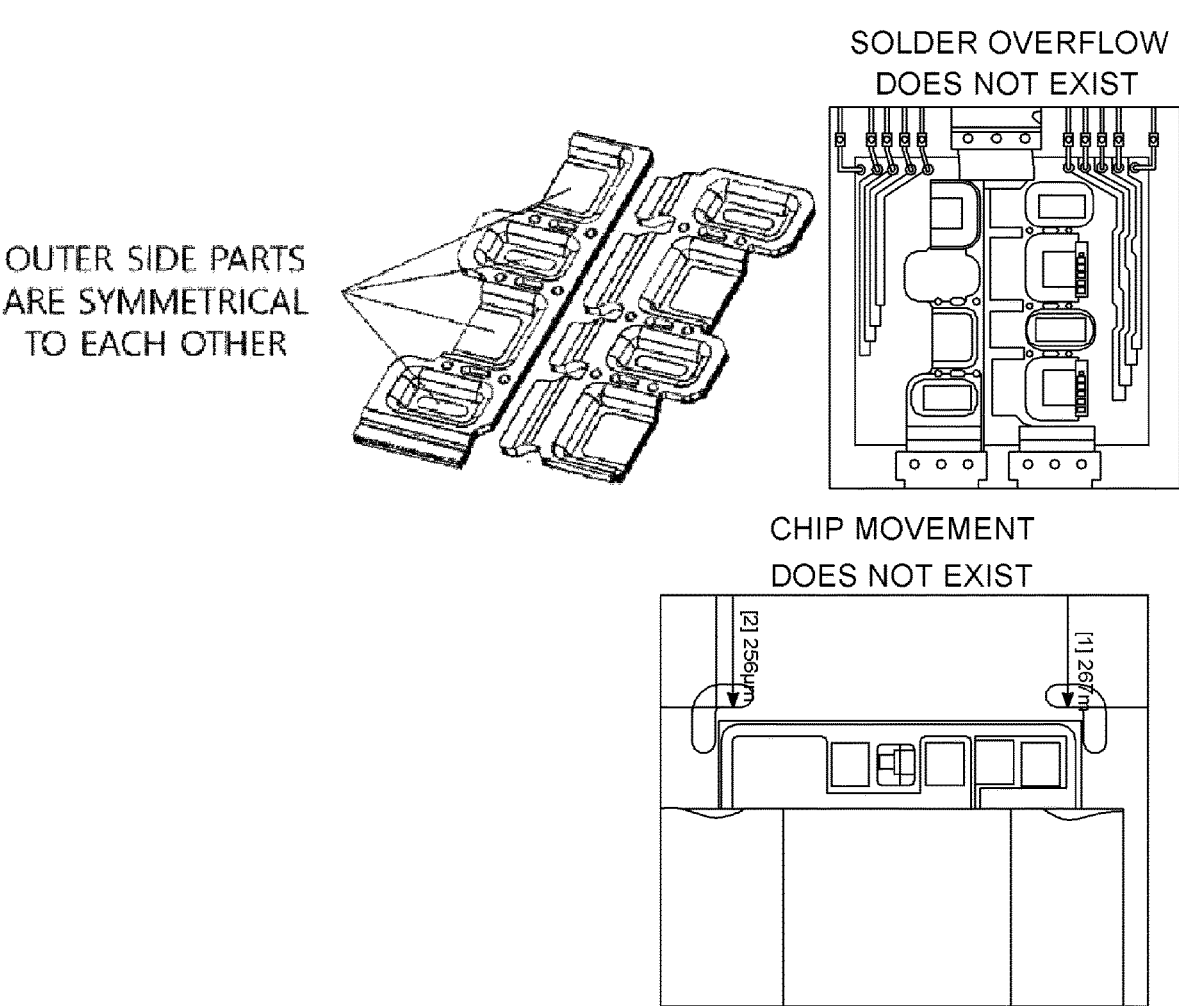
FIG. 34 is a view illustrating a soldered state when outer side parts are symmetrically formed in the metal clip.

FIG. 33 is a view illustrating a soldered state when outer side parts are asymmetrically formed in the metal clip. As illustrated in FIG. 33, it may be confirmed that solder overflow to an upper portion of the metal clip occurs, and lower chips are moved and rotated. FIG. 34 is a view illustrating a soldered state when outer side parts are symmetrically formed in the metal clip. As illustrated in FIG. 34, it may be confirmed that solder overflow to an upper portion of the metal clip does not occur and lower chips are not moved and rotated.

Meanwhile, referring to FIGS. 27 and 28 again, one or more through holes 330 penetrating through the metal clip 30 are formed in the metal clip 30. In this case, one or more through holes 330 are formed in a connection part connecting two adjacent bonding parts 310 of the plurality of bonding parts 310 to each other. The connection part may correspond to a portion of the outer side part 320. The through hole 330 formed in the connection part is a hole for securing fluidity of the molding material at the time of manufacturing the molding part described above, and may be formed in a size of 1000% or more of a particle size of the molding material. In addition, in order to satisfy such a condition, at least one of one or more through holes 330 may be formed in an elliptical shape. In this case, the through hole 330 having the elliptical shape may correspond to the ring groove 331 described above, and the metal clip may be fixed to the upper jig 520 of the soldering jig 50 at the time of soldering the power module through the through hole 330 having the elliptical shape.

As described above, the present invention provides the power module pack applied to the inverter, the power module accommodated in the power module pack, and the structure and the manufacturing method of the clip applied to the power module, through which performance of the inverter may be improved, manufacturing convenience may be secured, and a manufacturing yield may be increased.

According to the present invention, it is possible to improve thermal performance of the power module, secure structural stability of the power module, and simplify an assembly process of the power module by replacing the wire according to the related art connecting the chip and the substrate to each other with the metal clip.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A metal clip disposed on chips to connect the chips to each other, comprising:

a plurality of bonding parts each having a lower surface configured to bond to an upper surface of each of the chips; and an outer side part formed at each of the bonding parts to extend upward from an outermost edge portion of a respective one of the bonding parts such that a step is formed at the outermost part of the bonding part, wherein a lower portion of the outer side part includes a recessed s ace of cut-out formed therein.

2. The metal clip of claim 1, further comprising a pressing groove recessed inward along a boundary between an upper surface of each of the bonding parts and the outer side part, on the upper surface of each of the bonding parts.

3. The metal clip of claim 2, wherein the pressing groove of each of the bonding parts is formed by pressing an upper surface of a region in which the pressing groove of each of the bonding parts is formed.

4. The metal clip of claim 2, wherein the lower surface of each of the bonding parts is flat.

5. The metal clip of claim 1, wherein a thickness of the bonding part and a thickness of the outer side part are the same.

6. The metal clip of claim 1, wherein the outer side part is bent at a predetermined angle from the bonding part to extend upward.

7. The metal clip of claim 6, wherein an angle between a lower surface of the outer side part and the lower surface of the bonding part is less than a right angle.

8. The metal clip of claim 1, wherein the outer side part at each of the bonding parts is symmetrical to another outer side part respective to a center of a corresponding one of the bonding parts.

9. The metal clip of claim 1, wherein each of the bonding parts has a rectangular shape when viewed from above, and the outer side part at each of the bonding parts is formed at edges of respective ones of the bonding parts in three of four directions or in all the four directions.

10. The metal clip of claim 1, wherein one or more through holes penetrating through a connection part connecting two adjacent bonding parts of the plurality of bonding parts are formed in the connection part.

11. The metal clip of claim 10, wherein at least one of the one or more through holes is formed in an elliptical shape.

12. The metal clip of claim 1, further comprising a thermal interface material disposed within an internal cavity of at least one of the bonding parts, the thermal interface material being configured to enhance heat transfer from the bonding part to an external heat sink.

13. A metal clip disposed on chips to connect the chips to each other, comprising:

a plurality of bonding parts each having a lower surface configured to bond to an upper surface of each of the chips; and an outer side part formed at each of the bonding parts to extend upward from an outermost edge portion of a respective one of the bonding parts such that a step is formed at the outermost part of the bonding part, wherein one or more through holes penetrating through a connection part connecting two adjacent bonding parts of the plurality of bonding parts are formed in the connection part.

* * * * *